United States Patent
Byun et al.

(10) Patent No.: US 10,141,200 B2
(45) Date of Patent: Nov. 27, 2018

(54) METHODS OF MANUFACTURING SEMICONDUCTOR DEVICES

(71) Applicant: Samsung Electronics Co., Ltd., Suwon-si, Gyeonggi-do (KR)

(72) Inventors: Kyung-Mun Byun, Seoul (KR); Badro Im, Yongin-si (KR); Hong-Rae Kim, Seoul (KR); Sin-Hae Do, Busan (KR); Gyeong-Deok Park, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 15/613,822

(22) Filed: Jun. 5, 2017

(65) Prior Publication Data

US 2018/0012775 A1 Jan. 11, 2018

(30) Foreign Application Priority Data

Jul. 6, 2016 (KR) ........................ 10-2016-0085710

(51) Int. Cl.

| H01L 21/336 | (2006.01) |
|---|---|
| H01L 21/48 | (2006.01) |
| H01L 21/28 | (2006.01) |
| H01L 21/285 | (2006.01) |
| H01L 21/308 | (2006.01) |
| H01L 21/67 | (2006.01) |

(Continued)

(52) U.S. Cl.
CPC .... *H01L 21/4885* (2013.01); *H01L 21/28132* (2013.01); *H01L 21/28194* (2013.01); *H01L 21/28556* (2013.01); *H01L 21/308* (2013.01); *H01L 21/67138* (2013.01); *H01L 21/764* (2013.01); *H01L 21/823475* (2013.01)

(58) Field of Classification Search
CPC ...................... H01L 21/4885; H01L 21/28132
See application file for complete search history.

(56) References Cited

U.S. PATENT DOCUMENTS 7,811,924 B2 10/2010 Cui et al.
7,994,046 B2 8/2011 Jeng
(Continued)

FOREIGN PATENT DOCUMENTS

KR 20140028908 A 3/2014

*Primary Examiner* — Julio J Maldonado
*Assistant Examiner* — Andre' C Stevenson
(74) *Attorney, Agent, or Firm* — Harness, Dickey & Pierce, P.L.C.

(57) ABSTRACT

In a method of manufacturing a semiconductor memory device, a plurality of first conductive structures including a first conductive pattern and a hard mask are sequentially stacked on a substrate. A plurality of preliminary spacer structures including first spacers, sacrificial spacers and second spacers are sequentially stacked on sidewalls of the conductive structures. A plurality of pad structures are formed on the substrate between the preliminary spacer structures, and define openings exposing an upper portion of the sacrificial spacers. A first mask pattern is formed to cover surfaces of the pad structures, and expose the upper portion of the sacrificial spacers. The sacrificial spacers are removed to form first spacer structures having respective air spacers, and the first spacer structures include the first spacers, the air spacers and the second spacers sequentially stacked on the sidewalls of the conductive structures.

20 Claims, 27 Drawing Sheets

(51) Int. Cl.
*H01L 21/764* (2006.01)
*H01L 21/8234* (2006.01)

(56) References Cited

U.S. PATENT DOCUMENTS

| | | |
|---|---|---|
| 8,962,472 B2 | 2/2015 | Rho et al. |
| 9,024,371 B2 | 5/2015 | Lee et al. |
| 9,159,609 B2 | 10/2015 | Lee et al. |
| 9,202,774 B2 | 12/2015 | Yeom et al. |
| 9,257,437 B2 | 2/2016 | Park et al. |
| 9,305,882 B2 | 4/2016 | Nitta et al. |
| 9,318,379 B2 | 4/2016 | Lee et al. |
| 9,318,382 B2 | 4/2016 | Kim |
| 9,419,099 B2 * | 8/2016 | Hsu .................. H01L 21/82380 |
| 9,515,022 B2 * | 12/2016 | Kwon ................. H01L 27/1052 |
| 2012/0058639 A1 | 3/2012 | Sim et al. |
| 2013/0292835 A1 | 11/2013 | King et al. |
| 2015/0126013 A1 | 5/2015 | Hwang et al. |
| 2015/0228754 A1 | 8/2015 | Sung |
| 2015/0255466 A1 | 9/2015 | Hwang et al. |

\* cited by examiner

METHODS OF MANUFACTURING SEMICONDUCTOR DEVICES

CROSS-REFERENCE TO RELATED APPLICATION

This application claims priority under 35 USC § 119 to Korean Patent Application No. 10-2016-0085710, filed on Jul. 6, 2016, in the Korean Intellectual Property Office (KIPO), the contents of which are incorporated by reference herein in their entirety.

BACKGROUND

1. Field

Example embodiments relate to methods of manufacturing a semiconductor device. More particularly, example embodiments relate to a semiconductor device including a wiring structure.

2. Description of the Related Art

As a semiconductor device has been highly integrated, a distance between wirings, such as bit lines, may decrease, and thus a parasitic capacitance between the wirings may increase. Thus, a wiring structure having a relatively low parasitic capacitance may be needed.

SUMMARY

Example embodiments provide a method of manufacturing a semiconductor device including a wiring structure and having a relatively low parasitic capacitance.

According to example embodiments, there is provided a method of manufacturing a semiconductor device. In the method, a plurality of conductive structures are formed on a substrate. Each of the first conductive structures includes a first conductive pattern and a hard mask sequentially stacked. A plurality of preliminary spacer structures are formed on sidewalls of the conductive structures. The preliminary spacer structures include first spacers, sacrificial spacers and second spacers sequentially stacked. A plurality of pad structures are formed on the substrate between the preliminary spacer structures, and defining openings exposing an upper portion of the sacrificial spacers. A first mask pattern is formed on the pad structures. The mask pattern covers surfaces of the pad structures, and exposes the upper portion of the sacrificial spacers. The sacrificial spacers are removed to form first spacer structures having respective air spacers, and the first spacer structures include the first spacers, the air spacers and the second spacers sequentially stacked on the sidewalls of the conductive structures.

According to example embodiments, there is provided a method of manufacturing a semiconductor device. In the method, a plurality of conductive structures are formed on a substrate. Each of the conductive structures includes a first conductive pattern and a hard mask sequentially stacked. A plurality of first preliminary spacer structures are formed on sidewalls of the conductive structures. The first preliminary spacer structures include first spacers, sacrificial spacers and second spacers sequentially stacked. A plurality of pad structures are formed on the substrate between the first preliminary spacer structures, and defining openings exposing an upper portion of the sacrificial spacers. A plurality of second preliminary spacer structures are formed by removing the sacrificial spacers to form air spacers, and the second preliminary spacer structures include the first spacers, the air spacers and the second spacers sequentially stacked on sidewalls of the conductive structures. A mask pattern is formed on upper sidewalls of the first and second spacers, an inner surface of the openings and the pad structures, wherein the air spacers are not covered by the mask pattern. Sidewalls of the first and second spacers are etched using the mask pattern to form third and fourth spacers, respectively. Spacer structures are formed by forming a liner layer on surfaces of the third and fourth spacers and the openings, and the spacer structures include the third spacers, the fourth spacers, the liner layers and the air spacers. A filling insulation layer is formed on the liner layers to fill the openings.

According to example embodiments, a method includes forming a first conductive pattern on a substrate, forming first spacer structures on sidewalls of the first conductive pattern, each of the first spacer structures including a sacrificial spacer between respective first and second spacers, forming a second conductive pattern on the substrate between the first spacer structures, forming a third conductive pattern on the second conductive pattern, the third conductive pattern defining openings exposing the respective sacrificial spacers, and forming second spacer structures by removing the sacrificial spacers to form air spacers between the respective first and second spacers, the second spacer structures including the first spacers, the air spacers and the second spacers sequentially stacked on the sidewalls of the first conductive pattern.

According to example embodiments, in the etching process for forming the air spacer, the pad structure may not be exposed, so that a galvanic corrosion due to an etchant may be reduced or prevented. Thus, the semiconductor device may include the spacer structure including the air spacer having a relatively low dielectric constant.

BRIEF DESCRIPTION OF THE DRAWINGS

Example embodiments will be more clearly understood from the following detailed description taken in conjunction with the accompanying drawings. FIGS. 1A to 31 represent non-limiting, example embodiments as described herein.

FIGS. 1A and 1B are a cross-sectional view and a plan view, respectively, illustrating a semiconductor device in accordance with some example embodiments;

FIGS. 2 to 15 are cross-sectional views and plan views illustrating stages of a method of manufacturing a semiconductor device in accordance with some example embodiments;

FIG. 16 is a cross-sectional view illustrating a semiconductor device in accordance with some example embodiments;

FIGS. 17 to 21 are cross-sectional views illustrating stages of a method of manufacturing a semiconductor device in accordance with some example embodiments;

FIG. 22 is a cross-sectional view illustrating a DRAM device in accordance with some example embodiments;

FIGS. 23 to 30 are cross-sectional views illustrating the stages of the method of manufacturing the DRAM device;

FIG. 31 is a cross-sectional view illustrating a DRAM device in accordance with some example embodiments.

DETAILED DESCRIPTION

Various example embodiments will be described more fully hereinafter with reference to the accompanying drawings, in which some example embodiments are shown.

Figure 1A:
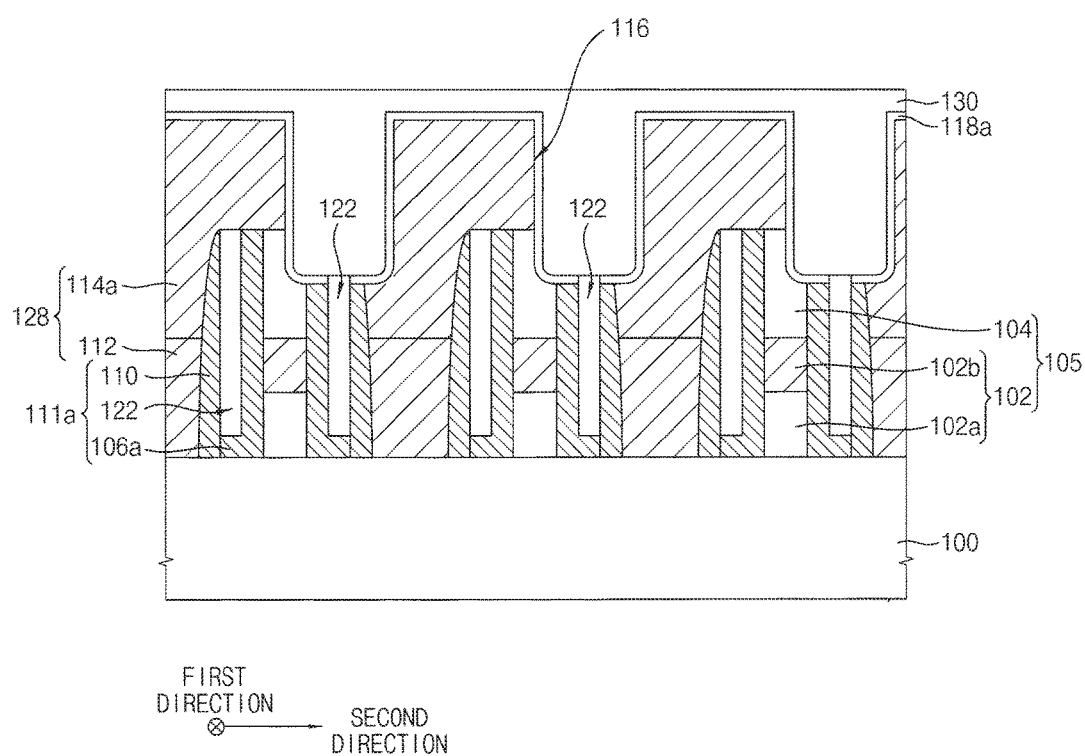
Figure 1B:
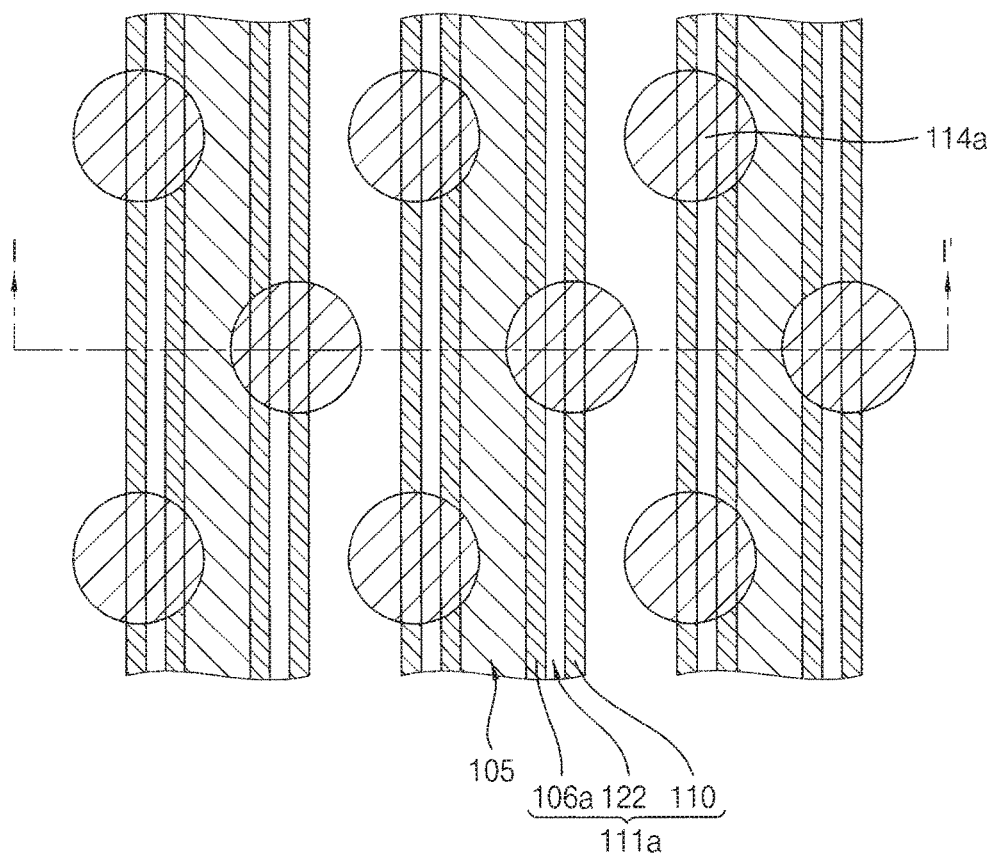

FIGS. 1A and 1B are a cross-sectional view and a plan view, respectively, illustrating a semiconductor device in accordance with some example embodiments.

FIG. 1A is a cross-sectional view taken along a line I-I' in FIG. 1B.

Referring to FIGS. 1A and 1B, the semiconductor device may include a conductive structure 105 on a substrate 100, a spacer structure 111a on a sidewall of the conductive structure 105, and a pad structure 128. In example embodiments, a plurality of conductive structures 105 and accordingly a plurality of spacer structures 111a may be formed, and the pad structure 128 may be formed between neighboring ones of the plurality of spacer structures 111a.

The substrate 100 may be a semiconductor substrate, e.g., a silicon substrate, a germanium substrate, a silicon-germanium substrate, a silicon-on-insulator (SOI) substrate, a germanium-on-insulator (GOI) substrate, etc.

The conductive structure 105 may include a first conductive pattern 102 and a hard mask 104 sequentially stacked. The first conductive pattern 102 may include, e.g., doped polysilicon, a metal, a metal nitride, a metal silicide, etc. In example embodiments, the first conductive pattern 102 may include a polysilicon pattern 102a and a metal pattern 102b sequentially stacked. A barrier pattern may be further formed between the polysilicon pattern 102a and the metal pattern 102b. The metal pattern 102b may include, e.g., tungsten. The hard mask 104 may include an insulating material having a relatively high etching selectivity with respect to an oxide layer. In example embodiments, the hard mask 104 may include a nitride, e.g., silicon nitride.

The conductive structure 105 may extend in a first direction, and a plurality of conductive structures 105 may be spaced apart from each other in a second direction substantially perpendicular to the first direction.

The spacer structure 111a may include a first spacer 106a, an air spacer 122 and a second spacer 110 sequentially stacked on a sidewall of the conductive structure 105.

The first spacer 106a may be formed on the sidewall of the conductive structure 105. The first spacer 106a may include, e.g., silicon nitride. The second spacer 110 may be spaced apart from the first spacer 106a at least partially, and thus the air spacer 122 may be formed between the first and second spacers 106a and 110. The second spacer 110 may include a material substantially the same as a material of the first spacer 106a. The second spacer 110 may include a nitride, e.g., silicon nitride.

In example embodiments, the air spacer 122 may surround the sidewall of the conductive structure 105. The air spacer 122 may face opposite sidewalls of the conductive structure 105, and may extend in the first direction. The opposite sidewalls may be referred to as a first sidewall and a second sidewall, respectively. In example embodiments, lower portions of the first and second spacers 106a and 110 may be connected to each other.

The air spacer 122 may include an air having a relatively low dielectric constant. Thus, a parasitic capacitance between the conductive structure 105 and the pad structure 128, and a parasitic capacitance between a plurality of the conductive structures 105 may decrease. Thus, a signal may be transmitted relatively quickly via the conductive structure 105.

An insulation layer (not shown) may fill a gap between the spacer structures 111a. The insulation layer may include silicon nitride.

The pad structure 128 may be formed on the substrate 100 through the insulation layer between the spacer structures 111a. That is, the pad structure 128 may be formed in a first opening (not shown) through the insulation layer.

In example embodiments, an upper surface of the pad structure 128 may be higher than a top surface of the conductive structure 105. The pad structure 128 may cover an outer surface of the spacer structure 111a and a portion of an upper surface of the conductive structure 105.

In example embodiments, the pad structure 128 may include a second conductive pattern 112 and a third conductive pattern 114a sequentially stacked. The second conductive pattern 112 may fill a lower portion of the gap between the spacer structures 111a.

An upper surface of the second conductive pattern 112 may be lower than the top surface of the conductive structure 105. The second conductive pattern 112 may include, e.g., polysilicon. In example embodiments, the second conductive pattern 112 may contact the substrate 100.

The third conductive pattern 114a may include a conductive material having a relatively low resistance. The third conductive pattern 114a may include a metal, a metal nitride, a metal silicon, etc. For example, the third conductive pattern 114a may include tungsten.

A plurality of third conductive patterns 114a may be spaced apart from each other, and thus, the third conductive patterns 114a may have an island shape from each other. A top surface of the third conductive pattern 114a may be higher than the top surface of the conductive structure 105. The third conductive pattern 114a may contact an upper surface of the second conductive pattern 112, and may cover an upper portion of the spacer structure 111a and the top surface of the conductive structure 105.

A space between the third conductive patterns 114a may be defined as a second opening 116. The air spacer 122 may be disposed under the second opening 116 between the third conductive patterns 114a. That is, a portion of the second opening 116 may overlap the air spacer 122.

When the second opening 116 is formed, an upper portion of the conductive structure 105 and upper portions of the first and second spacers 106a and 110 may be partially etched simultaneously. Thus, a cross-section of a portion of the spacer structure 111a on the first sidewall of the conductive structure 105 may have a shape different from a cross-section of a portion of the spacer structure 111a on the second sidewall of the conductive structure 105. A height of an upper surface of the spacer structure 111a overlapped by the second opening 116 may be less than a height of an upper surface of the spacer structure 111a that is not overlapped by the second opening 116.

In example embodiments, the third conductive patterns 114a may be arranged in a honeycomb shape. That is, the third conductive patterns 114a may be disposed at vertices and centers of hexagons, and thus distances, between neighboring ones of the third conductive patterns 114a may be substantially the same as each other. Accordingly, the disturbance between the third conductive patterns 114a may decrease. In example embodiments, the third conductive patterns 114a may be arranged in the second direction, and may be disposed in a zigzag fashion in the first direction.

As described above, the spacer structure 111a including the air spacer 122 may be formed on the sidewall of the conductive structure 105. The pad structure 128 including the second and third conductive patterns 112 and 114a sequentially stacked may be formed on the substrate 100 between the spacer structures 111a.

A capping pattern 118a may cover the pad structure 128, the conductive structure 105, the first and second spacers 106a and 110 and the insulation layer (not shown). The capping pattern 118a may protect the third conductive pattern 114a included in the pad structure 128. Thus, the capping pattern 118a may cover the upper surface and the sidewall of the third conductive pattern 114a. The capping pattern 118a may include an insulation material. In example embodiments, the capping pattern 118a may include a material substantially the same as a material of the hard mask. For example, the capping pattern 118a may include silicon nitride. The capping pattern 118a may have a thickness of about 1 Å to about 100 Å.

A filling insulation layer 130 may be formed on the capping pattern 118a and the air spacer 122 to fill the second opening 116. The filling insulation layer 130 may cover a top surface of the air spacer 122, but may not fill the air spacer 122. In example embodiments, the filling insulation layer 130 may include silicon nitride.

The semiconductor device may include the spacer structure 111a on the sidewall of the conductive structure 105, and the spacer structure 111a may include the first spacer 106a, the air spacer 122 and the second spacer 110 sequentially stacked. The air spacer 122 may extend in the first direction. The pad structure 128 including the second and third conductive patterns 112 and 114a sequentially stacked may be formed on the substrate 100 between the spacer structures 111a.

The semiconductor may have the spacer structure 111a including the air spacer 122. Thus, a parasitic capacitance between the conductive structure 105 and the pad structure 128, and a parasitic capacitance between the conductive structures 105 may decrease. Also, corrosions of the conductive structure 105 and the pad structure 128 may decrease.

FIGS. 2 to 15 are cross-sectional views and plan views illustrating stages of a method of manufacturing a semiconductor device in accordance with some example embodiments.

Figure 6:
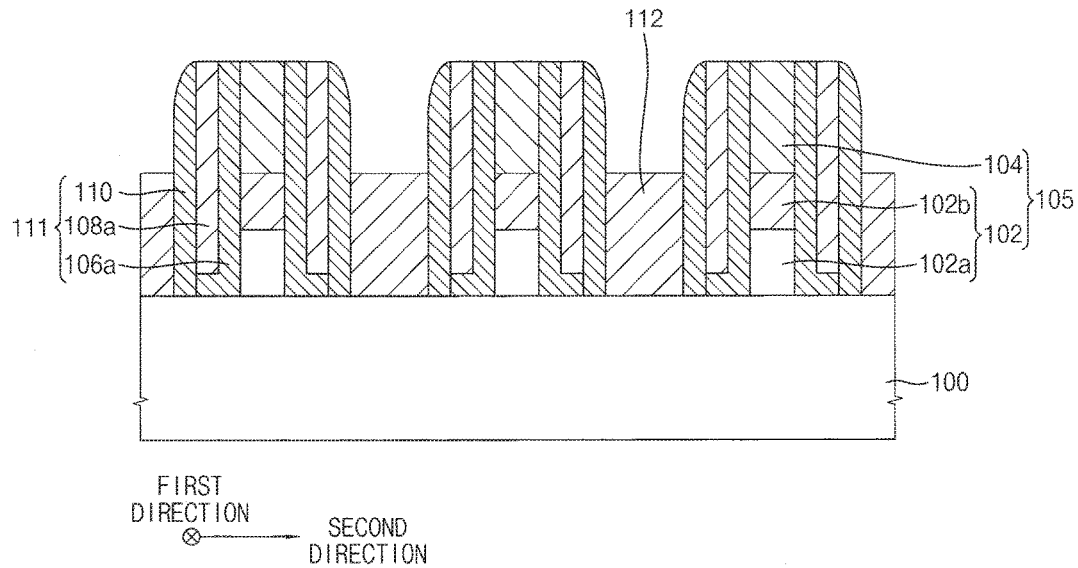
Figure 7:
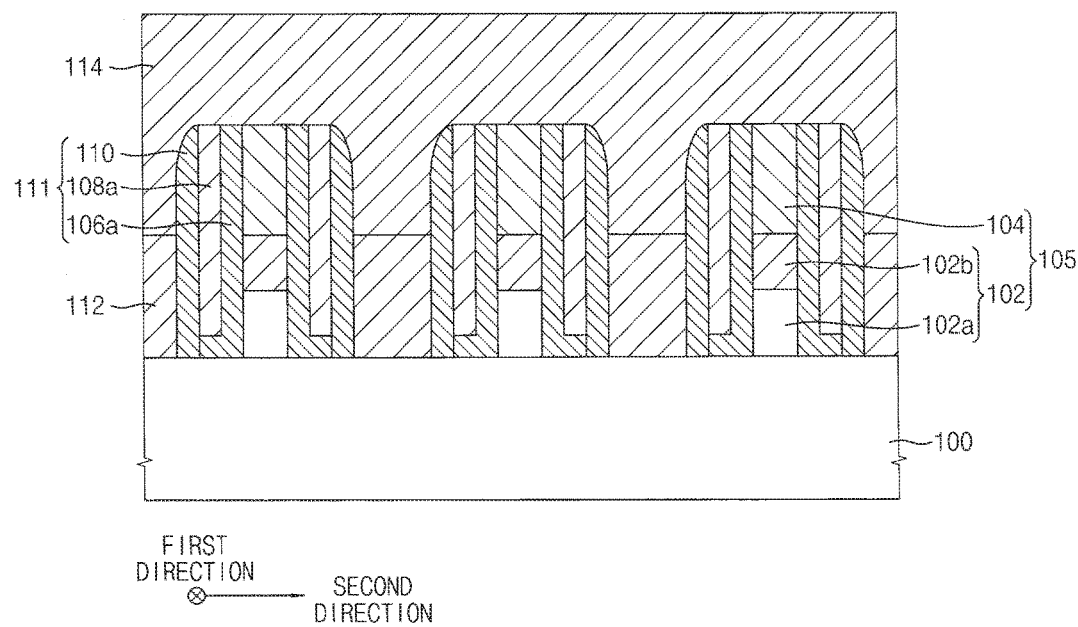
Figure 8:
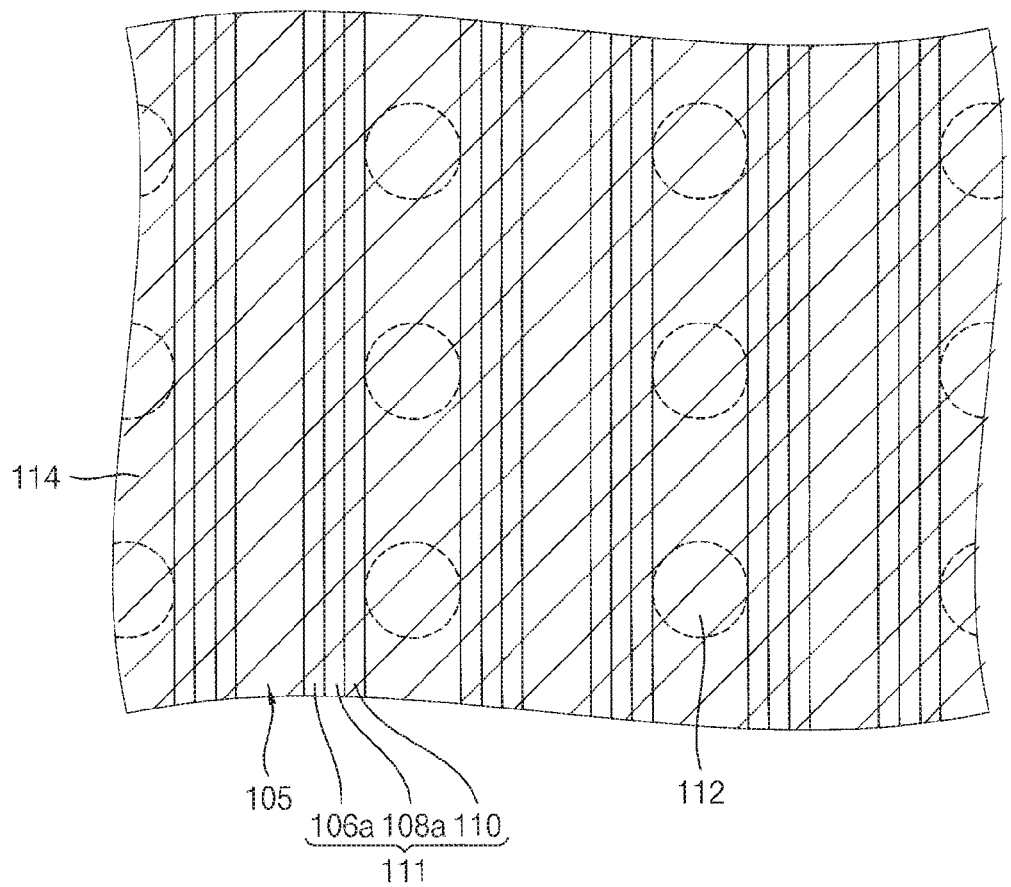
Figure 9:
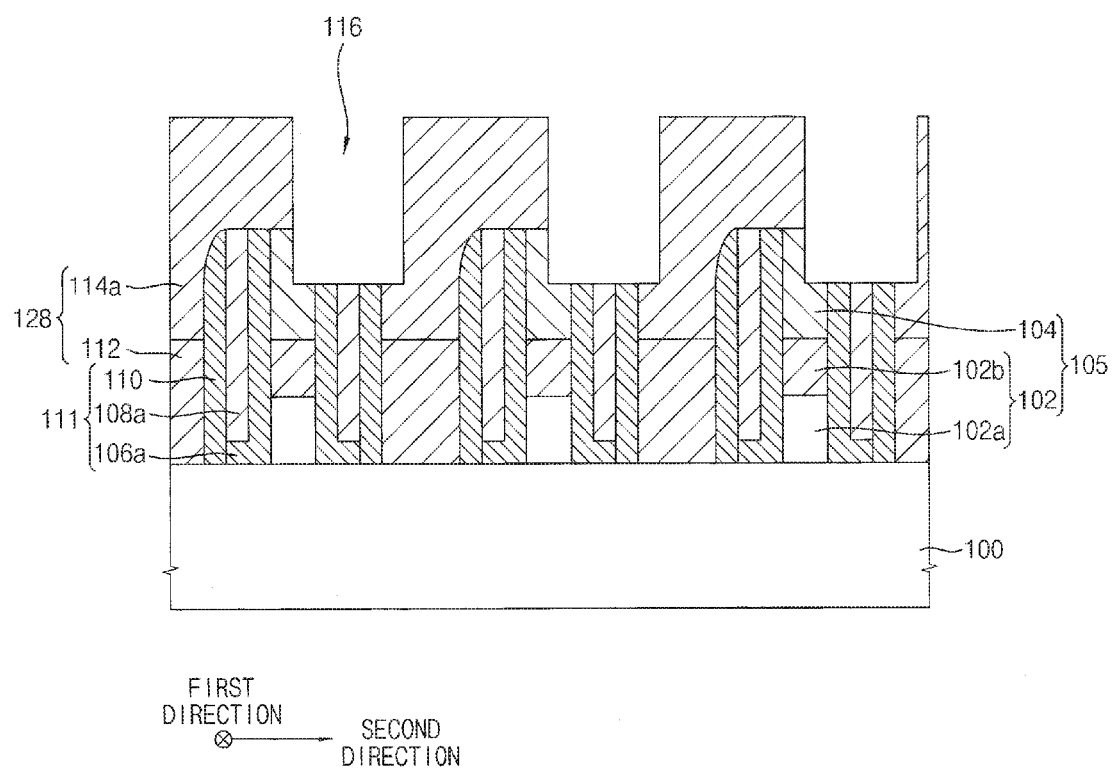
Figure 10:
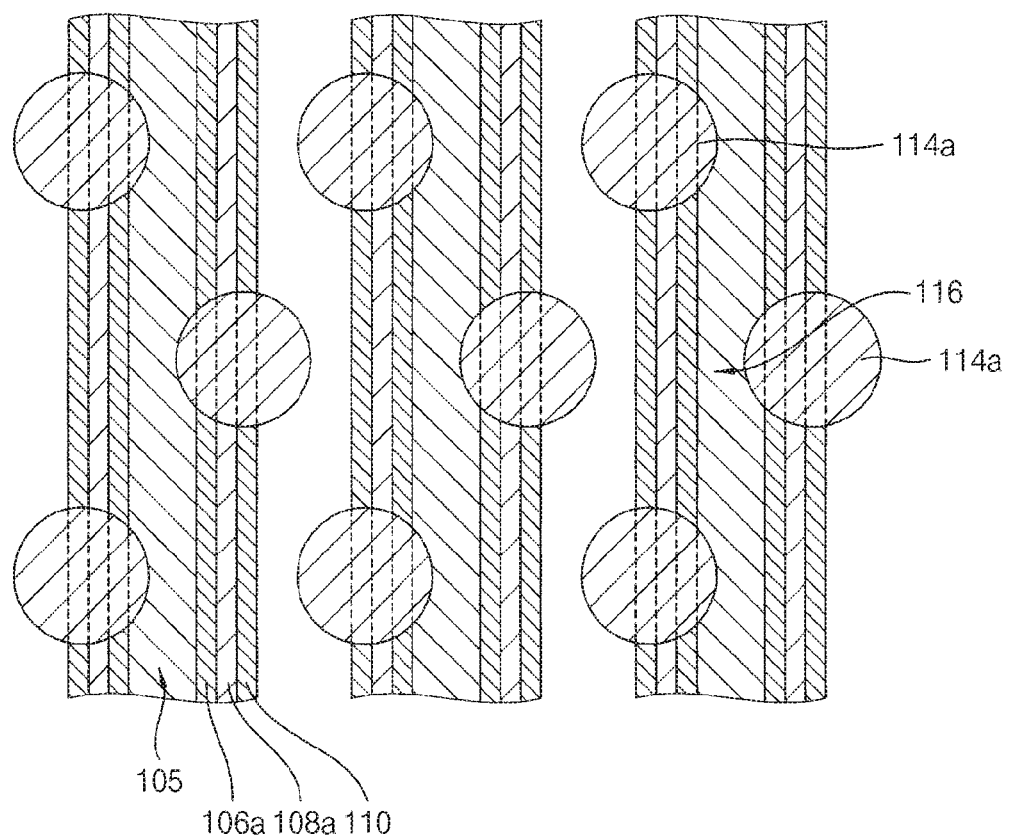

Namely, FIGS. 2 to 7, 9, 11 to 15 are cross-sectional views, and FIGS. 8 and 10 are plan views.

Figure 2:
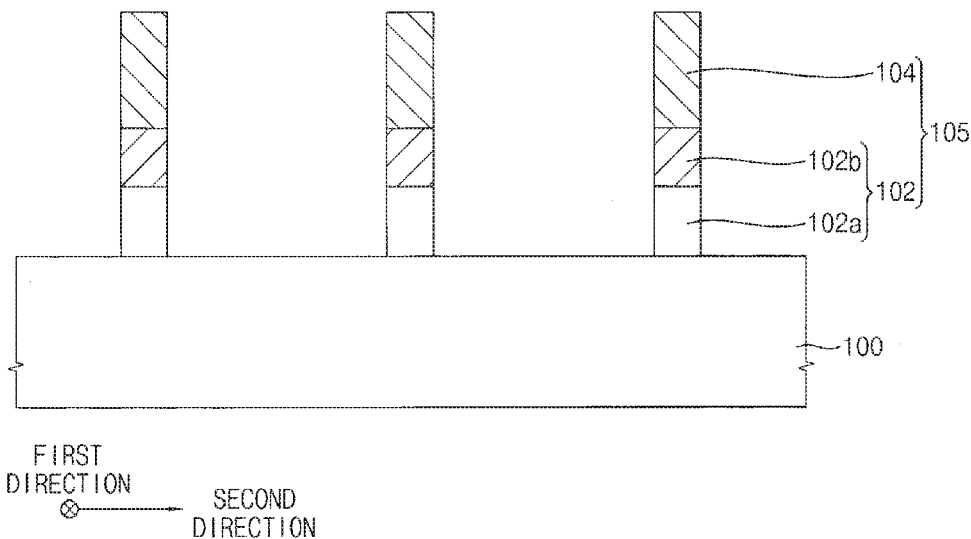

Referring to FIG. 2, a conductive structure 105 may be formed on a substrate 100. The conductive structure 105 may include a first conductive pattern 102 and a hard mask 104 sequentially stacked.

Particularly, a first conductive layer and a hard mask layer may be sequentially formed on the substrate 100. The hard mask layer may be patterned by a photolithography process using a photoresist pattern (not shown), so that the hard mask 104 may be formed on the first conductive layer. The first conductive layer may be etched using the hard mask 104 as an etching mask to form the conductive structure 105 including the first conductive pattern 102 and the hard mask 104 sequentially stacked.

In example embodiments, the conductive structure 105 may extend in the first direction. A plurality of conductive structures 105 may be formed in the second direction.

The substrate 100 may be a silicon substrate, a germanium substrate, a silicon-germanium substrate, an SOI substrate, a GOI substrate, etc. The substrate 100 may include an isolation layer pattern and/or impurity regions therein.

The first conductive layer may be formed of, e.g., doped polysilicon, a metal, a metal nitride, a metal silicide, etc. In example embodiments, the first conductive layer may be formed to include a polysilicon layer and a metal layer sequentially stacked. In this case, the first conductive pattern 102 may include a polysilicon pattern 102a and a metal pattern 102b sequentially stacked. In example embodiments, a barrier layer may be further formed between the polysilicon layer and the metal layer. The metal layer may include, e.g., tungsten.

The hard mask layer may be formed of an insulating material having a relatively high etching selectivity with respect to an oxide layer. The hard mask layer may be formed of a nitride, e.g., silicon nitride.

Figure 3:
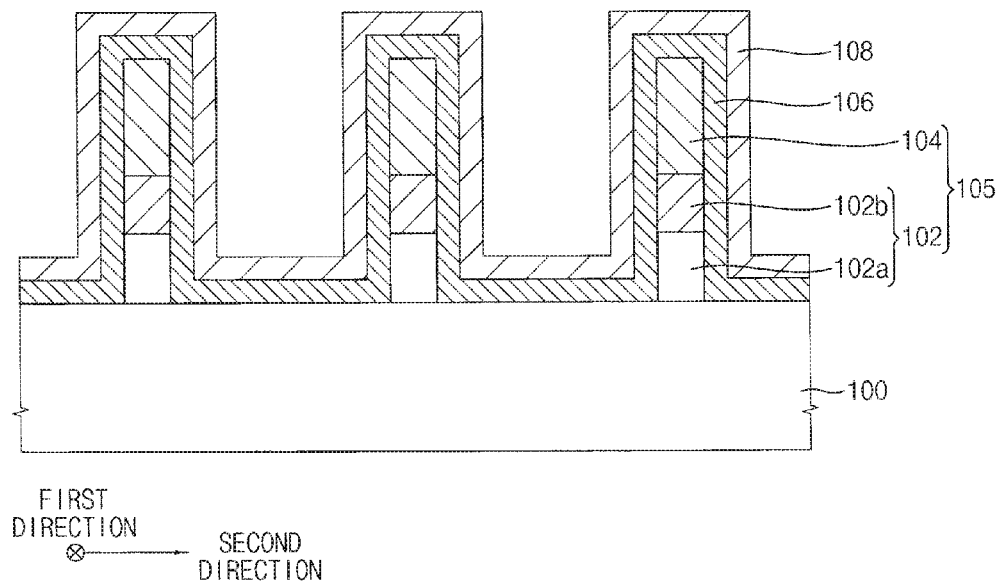

Referring to FIG. 3, a first spacer layer 106 and a first sacrificial layer 108 may be sequentially formed on the substrate 100 to cover the conductive structure 105.

The first spacer layer 106 may be formed of a material substantially the same as or similar to a material of the hard mask 104. The first spacer layer 106 may be subsequently removed to form an air spacer 122 (refer to FIG. 13). Thus, the sacrificial spacer layer 108 may be formed of a material having a high etching selectivity with respect to the first spacer layer 106.

In example embodiments, the first spacer layer 106 may include silicon nitride, and the first sacrificial layer 108 may include silicon oxide.

The first sacrificial layer 108 may include, e.g., Boro-Phospho-Silicate Glass (BPSG), Tonen Silazene (TOSZ), Undoped Silicate Glass (USG), Spin On Glass (SOG), Flowable Oxide (FOX), Tetra-Ethyl-Ortho-Silicate (TEOS) or High Density Plasma Chemical Vapor Deposition (HDP-CVD) oxide, etc. The first spacer layer 106 and the first sacrificial layer 108 may be formed by a chemical vapor deposition (CVD) process or an atomic layer deposition (ALD) process.

Figure 4:
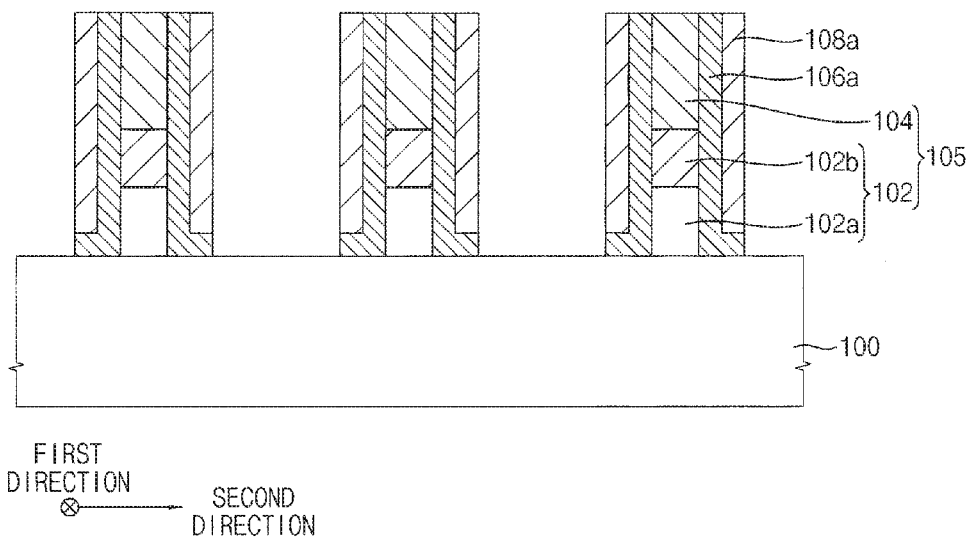

Referring to FIG. 4, the first spacer layer 106 and the first sacrificial layer 108 may be anisotropically etched to form a first spacer 106a and a sacrificial spacer 108a, respectively, on a sidewall of the conductive structure 105. The anisotropic etching process may include a dry etching process.

Figure 5:
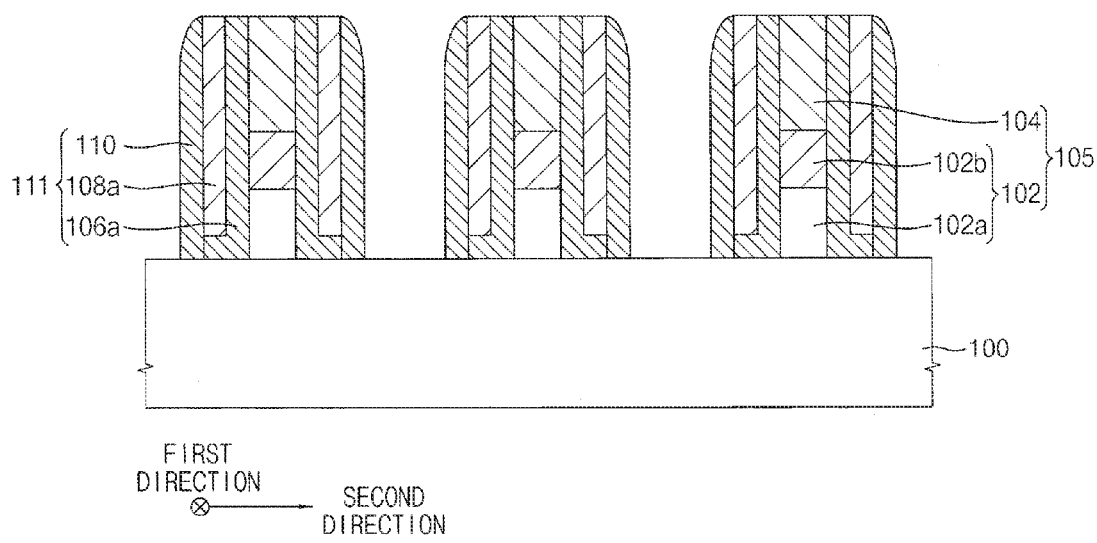

Referring to FIG. 5, a second spacer 110 may be formed on the sacrificial spacer 108a. Thus, a preliminary spacer structure 111 including the first spacer 106a, the sacrificial spacer 108a and the second spacer 110 sequentially stacked on the sidewall of the conductive structure 105 may be formed.

Particularly, a second spacer layer may be formed on the conductive structure 105, the sacrificial spacer 108a and the first spacer 106a. The second spacer layer may be formed by a CVD process or an ALD process. In example embodiments, the second spacer layer may be formed of a material substantially the same as a material of the first spacer 106a. Then, the second spacer layer may be anisotropically etched to form the second spacer 110 on the sacrificial spacer 108a.

Referring to FIG. 6, an insulation layer (not shown) may be formed to fill a gap between the preliminary spacer structures 111. The insulation layer may be partially etched to form a first opening (not shown) exposing an upper surface of the substrate 100. A second conductive pattern 112 may be formed to fill the first opening. Thus, the second conductive pattern 112 may be formed on the exposed upper surface of the substrate 100.

The second conductive pattern 112 may be formed by forming a second conductive layer on the conductive structure 105 to sufficiently fill the first opening, and removing an upper portion of the second conductive layer by an etch back process. The second conductive layer may include, e.g., polysilicon. Alternatively, the second conductive pattern 112 may be formed by forming a second conductive layer on the conductive structure 105 to sufficiently fill the first opening, planarizing an upper portion of the second conductive layer by a chemical mechanical polishing (CMP) process, and removing the upper portion of the second conductive layer by an etch back process.

An upper surface of the second conductive pattern 112 may be lower than an upper surface of the conductive structure 105.

Referring to FIGS. 7 and 8, a third conductive layer 114 may be formed on the second conductive pattern 112, the insulation layer and the conductive structure 105 to sufficiently fill a gap between the preliminary spacer structures 111.

The third conductive layer 114 may be formed of a material having a resistance lower than a resistance of the second conductive pattern 112. The third conductive layer 114 may be formed of, e.g., a metal, a metal nitride, metal silicon, etc. For example, the third conductive layer 114 may be formed of tungsten. The third conductive layer 114 may be formed by a CVD process, an ALD process or a physical vapor deposition (PVD) process.

Referring to FIGS. 9 and 10, the third conductive layer 114 may be patterned to form a third conductive pattern 114a on the second conductive pattern 112. Thus, the second and third conductive patterns 112 and 114a sequentially stacked may form a pad structure 128. The third conductive pattern 114a may serve as a pad pattern.

A plurality of third conductive patterns 114a may be formed to be spaced apart from each other, and thus the third conductive patterns 114a may have an island shape from each other. A space between the third conductive patterns 114a may be referred to as a second opening 116. A bottom of the second opening 116 may be lower than a top surface of the conductive structure 105.

The third conductive pattern 114a may contact a portion of an upper surface of the conductive structure 105, a portion of the preliminary spacer structure 111 and an upper surface of the second conductive pattern 112. Thus, the third conductive pattern 114a may be electrically connected to the second conductive pattern 112.

When the third conductive layer 114 is etched to form the third conductive pattern 114a, an upper portion of the preliminary spacer structure 111 and an upper portion of the conductive structure 105 may be etched simultaneously. Thus, the upper portion of the preliminary spacer structure 111 and the upper portion of the conductive structure 105 may be exposed by the second opening 116 between the third conductive patterns 114a. That is, the sacrificial spacer 108a included in the preliminary spacer structure 111 may be exposed by the second opening 116.

As the upper portion of the preliminary spacer structure 111 and the upper portion of the conductive structure 105 may be etched, a portion of the preliminary spacer structure 111 overlapping the second opening 116 and a portion of the preliminary spacer structure 111 not overlapping the second opening may have different shapes from each other, in a cross-sectional view. A bottom of the second opening 116 may be lower than a top surface of the conductive structure 105.

In example embodiments, the third conductive patterns 114a may be formed in a honeycomb shape. That is, the third conductive patterns 114a may be disposed at vertices and centers of hexagons. In example embodiments, the third conductive patterns 114a may be formed in the second direction, and may be disposed in a zigzag fashion in the first direction.

Figure 11:
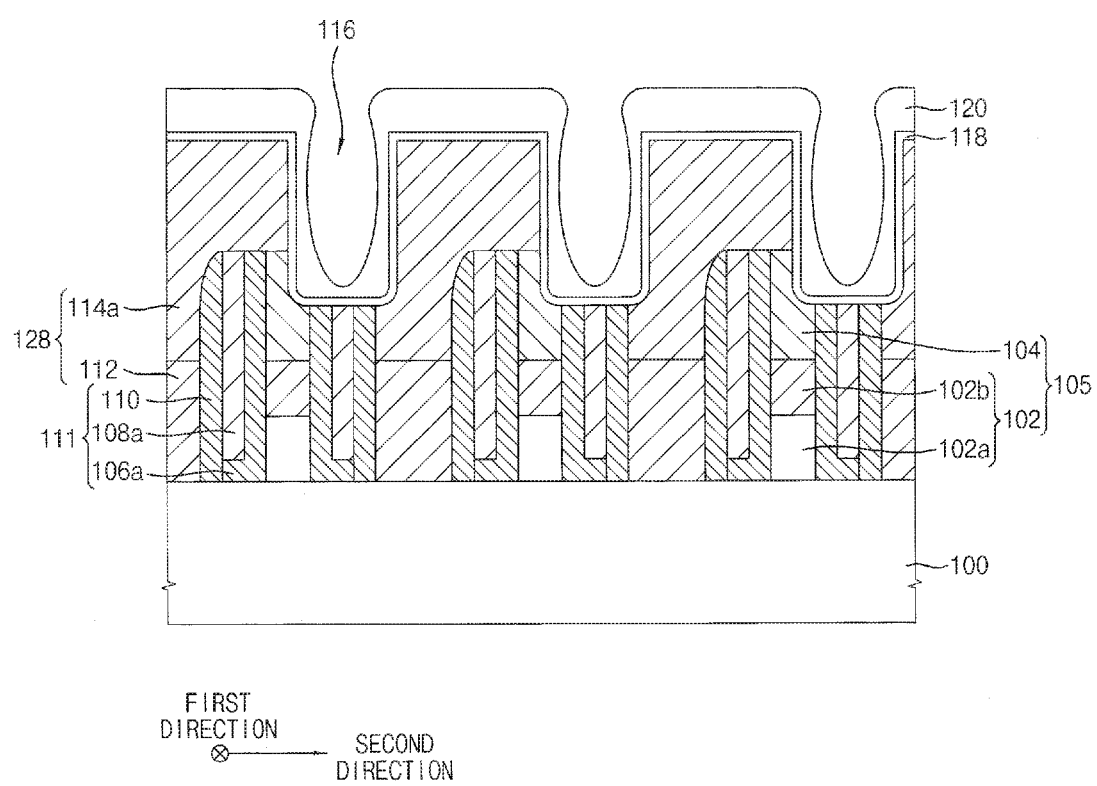

Referring to FIG. 11, a first capping layer 118 may be conformally formed on the third conductive pattern 114a, the conductive structure 105 and the preliminary spacer structure 111 exposed by the second opening 116. A first mask layer 120 may be formed on the first capping layer 118.

The first capping layer 118 may protect a surface of the third conductive pattern 114a. The first capping layer 118 may include an insulation material. In example embodiments, the first capping layer 118 may include a material substantially the same as a material of the hard mask 104. In example embodiments, the first capping layer 118 may include silicon nitride. In example embodiments, the capping layer 118 may be formed by an ALD process having an improved step coverage characteristic. In example embodiments, the capping layer 118 may be formed to have a thickness of about 1 Å to about 100 Å.

The first mask layer 120 on an upper surface of the third conductive pattern 114a may have a first thickness, and the first mask layer 120 on the sidewall and the bottom of the second opening 116 may have a second thickness less than the first thickness.

The first mask layer 120 may serve as an etching mask for forming the air spacer 122. The first mask layer 120 may be formed by a deposition process having an undesirable step coverage characteristic, so that the first mask layer 120 may be deposited at selected portions. Also, the first mask layer 120 may be formed of a material that may have a relatively high etching selectivity with respect to the sacrificial spacer 108a and may be more easily removed by a wet etching process. In example embodiments, the first mask layer 120 may include, e.g., carbon. For example, the first mask layer 120 may be formed of amorphous carbon by a low pressure chemical vapor deposition (LP-CVD) process.

The first mask layer 120 may be formed to have a thickness greater than a thickness of the first capping layer 118. The first mask layer 120 may be formed to partially fill the second opening 116. In example embodiments, the first mask layer 120 on the upper surface of the third conductive pattern 114a may have a thickness of about 300 Å to about 3000 Å.

Figure 12:
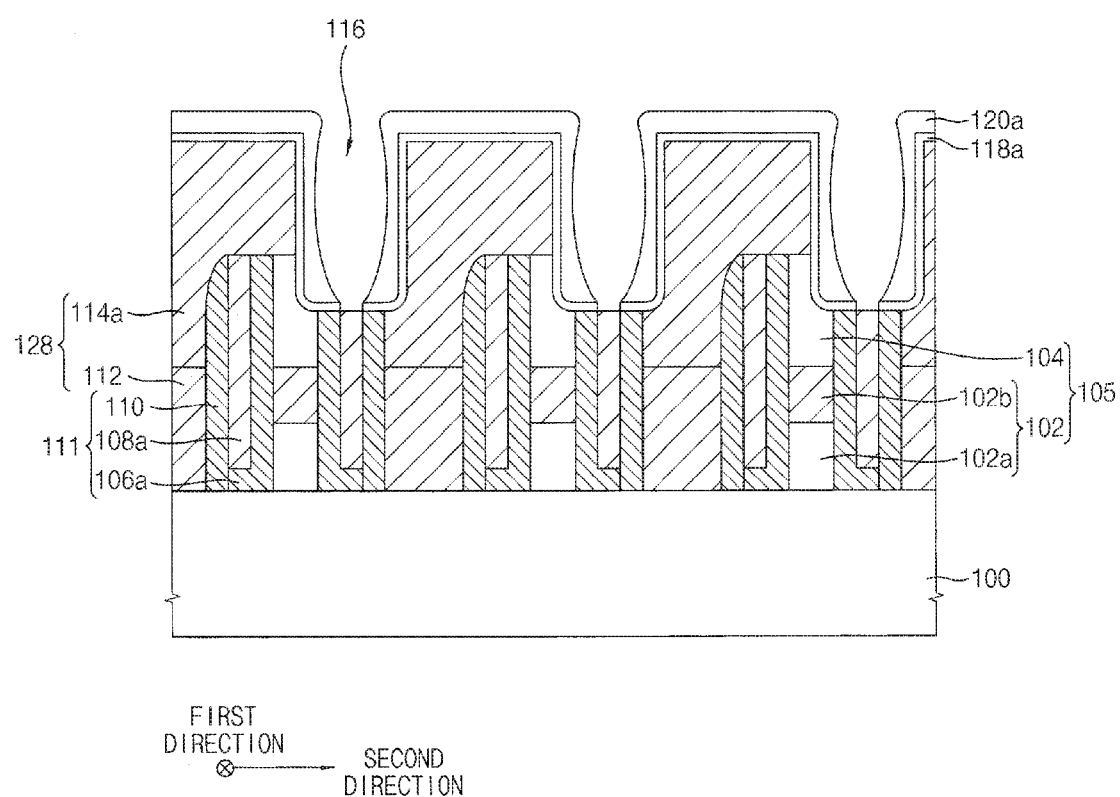

Referring to FIG. 12, the first mask layer 120 and the first capping layer 118 may be anisotropically etched to form a first mask 120a and a capping pattern 118a, respectively. The etching process may be performed such that the upper surface of the sacrificial spacer 108a may be exposed by the second opening 116. Also, the first mask 120a may cover the third conductive pattern 114a.

Particularly, the first mask layer 120 may be anisotropically etched until an upper surface of the first capping layer 118 may be exposed by the second opening 116. During the etching process, the first mask layer 120 on the upper surface of the third conductive pattern 114a and the first mask layer 120 on the bottom of the second opening 116 may be etched. The first mask layer 120 on the upper surface of the third conductive pattern 114a may have the first thickness, and the first mask layer 120 on the sidewall and the bottom of the second opening may have the second thickness less than the first thickness. Thus, after the etching process, the first mask layer 120 may remain on the upper surface of the third conductive pattern 114a and the sidewall of the second opening 116 to form the first mask 120a.

Then, the exposed first capping layer 118 may be anisotropically etched, so that an upper surface of the sacrificial spacer 108a may be exposed by the second opening 116. Also, the capping pattern 118a and the first mask 120a may be formed on the surface of the third conductive pattern 114a and the sidewall of the second opening 116.

The capping pattern 118a and the first mask 120a may be formed on the surface of the third conductive pattern 114a, so that the surface of the third conductive pattern 114a may not be exposed.

Figure 13:
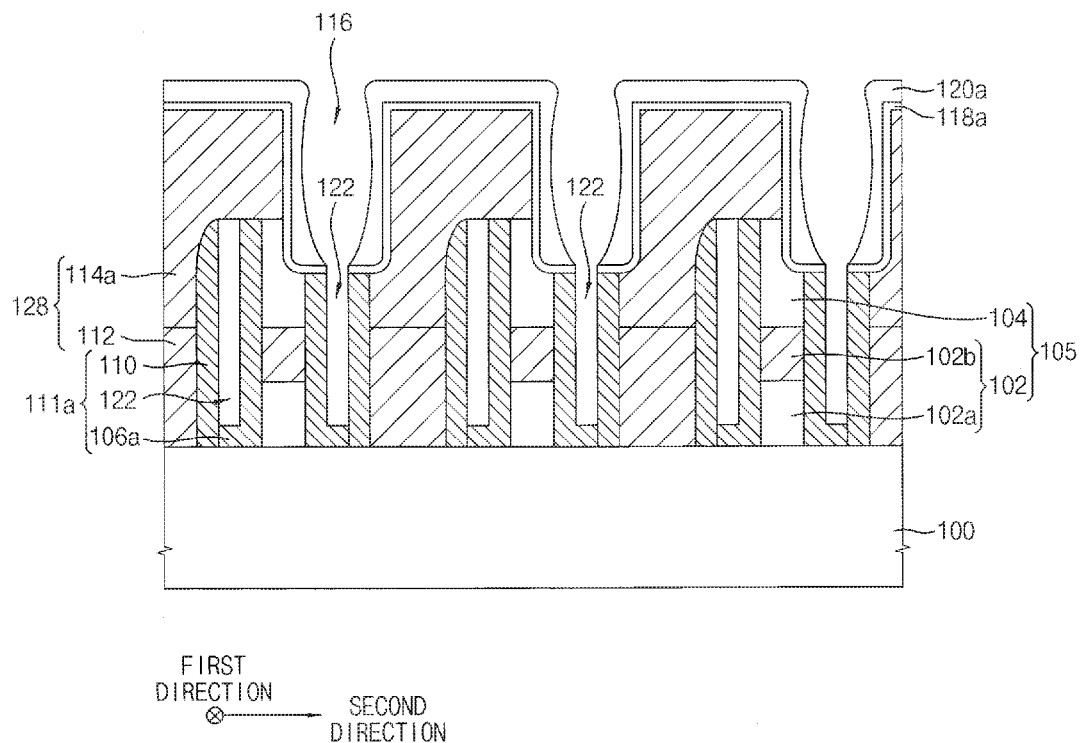

Referring to FIG. 13, the sacrificial spacer 108a may be isotropically etched to form the air spacer 122. The isotropic etching process may include, e.g., a wet etching process.

During the isotropic etching process, an etchant may permeate into the sacrificial spacer 108a exposed by the second opening 116, so that the sacrificial spacer 108a may be removed by the etchant. Thus, the air spacer 122 may be formed between the first and second spacers 106a and 110 to extend in the first direction. An upper portion of the air spacer 122 may be in communication with the second opening 116.

In example embodiments, the sacrificial spacer 108a may be etched using an etchant including hydrogen fluoride (HF). For example, the etchant may include, e.g., LAL solution and/or buffer oxide etchant (BOE) solution, etc. The LAL solution may include $H_2O$, HF and $NH_4F$.

The etchant may be electrolyte solution. When metal patterns are disposed to be opposite to each other in the electrolyte solution, electron paths may be generated by a potential difference between the metal patterns. Thus, galvanic corrosion may occur by the electron paths. For example, during etching the sacrificial spacer 108a, the etchant may directly contact the third conductive pattern 114a so as to permeate into the third conductive pattern 114a. Thus, a conductive structure and the third conductive pattern 114a may have a galvanic corrosion structure, so that the conductive structure and/or the third conductive pattern 114a may be corroded.

However, in example embodiments, the capping pattern 118a and the first mask 120a may cover the surface of the third conductive pattern 114a. Thus, during etching the sacrificial spacer 108a, the third conductive pattern 114a may not directly contact the etchant, so that galvanic corrosion may not occur.

If patterns and/or structures except for the sacrificial spacer 108a are exposed before etching the sacrificial spacer 108a, the patterns and/or structures may be damaged during the etching process. Thus, before the etching the sacrificial spacer 108a, a photoresist pattern may be further formed to cover a portion of the substrate 100, e.g., a peripheral region thereof.

However, in example embodiments, the capping pattern 118a and the first mask 120a may cover the conductive structure 105 and the third conductive pattern 114a, except for a portion of a bottom of the second opening 116. That is, the first mask 120a may be used instead of the photoresist pattern to cover the portion of the substrate 100. Thus, forming the photoresist pattern may be skipped, so that the process may be simplified.

Figure 14:
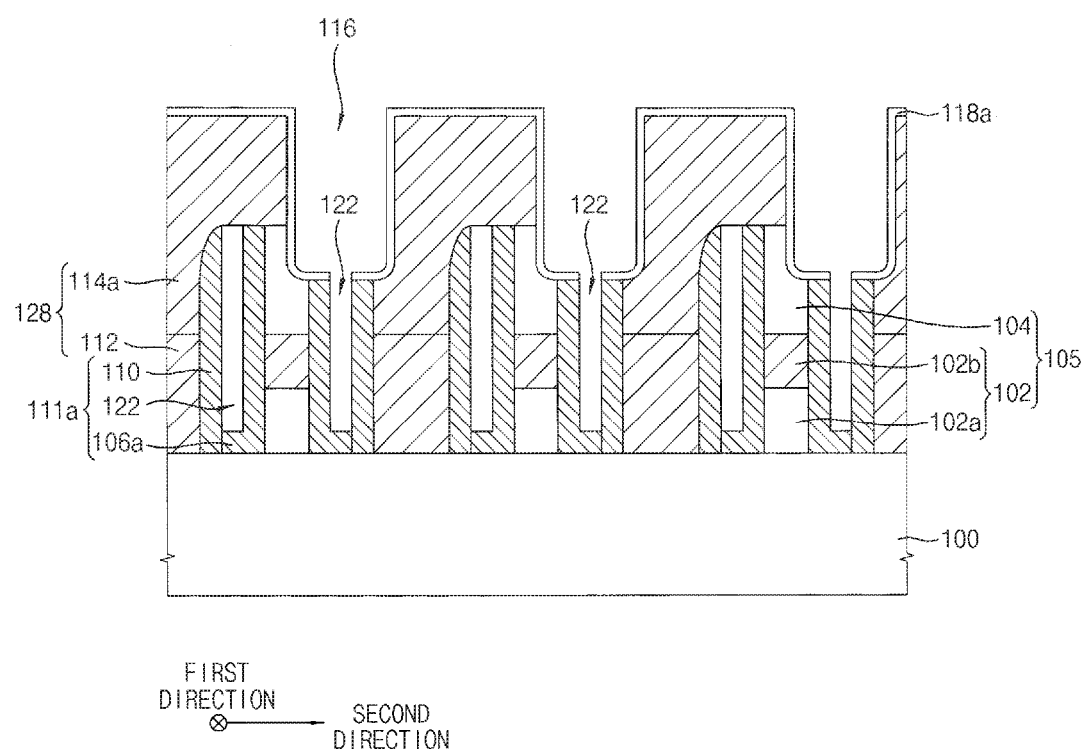

Referring to FIG. 14, the first mask 120a may be removed. In example embodiments, the first mask 120a may be removed by an ashing process using oxygen plasma.

During removing the first mask 120a, the capping pattern 118a may not be removed. Thus, the capping pattern 118a may cover the sidewall and the upper surface of the third conductive pattern 114a and an inner surface of the second opening 116. That is, the third conductive pattern 114a may be protected by the capping pattern 118a.

Figure 15:
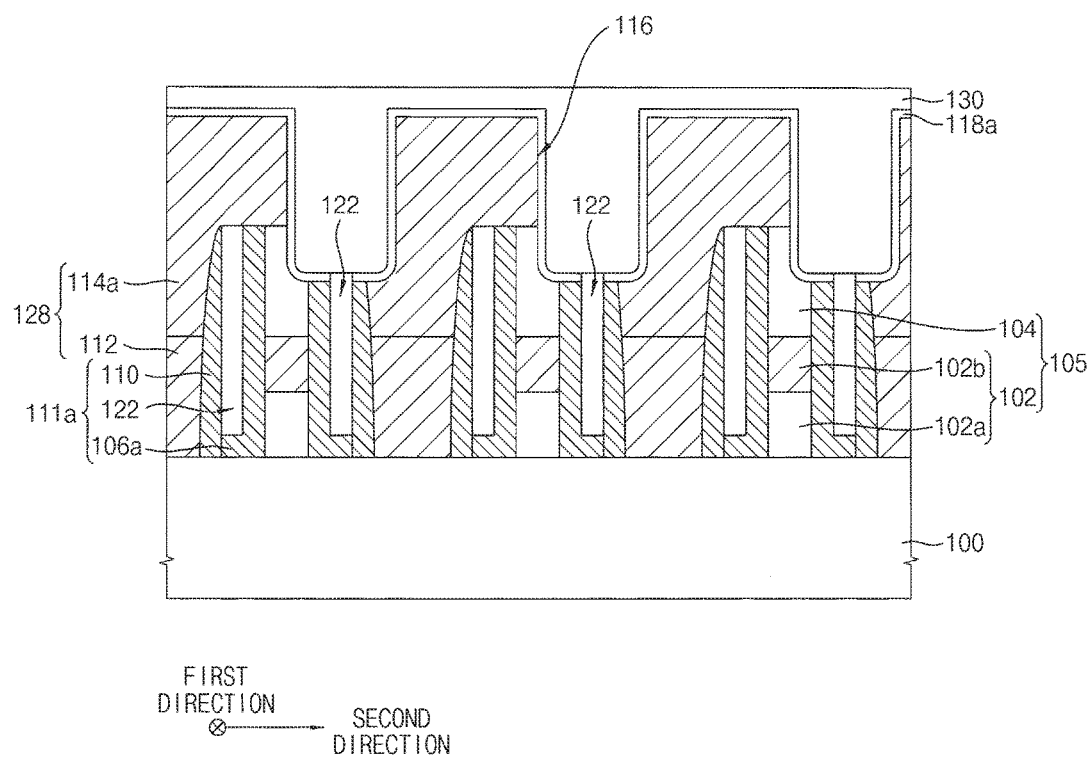

Referring to FIG. 15, a filling insulation layer 130 may be formed to fill the second opening 116. However, the filling insulation layer 130 may not fill the air spacer 122. In example embodiments, the filling insulation layer 130 may be formed of silicon nitride by a CVD process.

The filling insulation layer 130 may cover a top of the air spacer 122. Thus, a spacer structure 111a including the first spacer 106a, the air spacer 122 and the second spacer 110 sequentially stacked may be formed on the sidewall of the conductive structure 105.

As described above, the spacer structure 111a including the air spacer 122 may be formed on the sidewall of conductive structure 105. Also, the pad structure 128 including the second and third conductive patterns 112 and 114a sequentially stacked may be formed in the gap between the spacer structures 111a. A cross-section of a portion of the spacer structure 111a on the first sidewall of the conductive structure 105 may have a shape different from that of a cross-section of a portion of the spacer structure 111a on the second sidewall opposite to the first sidewall of the conductive structure 105.

Figure 16:
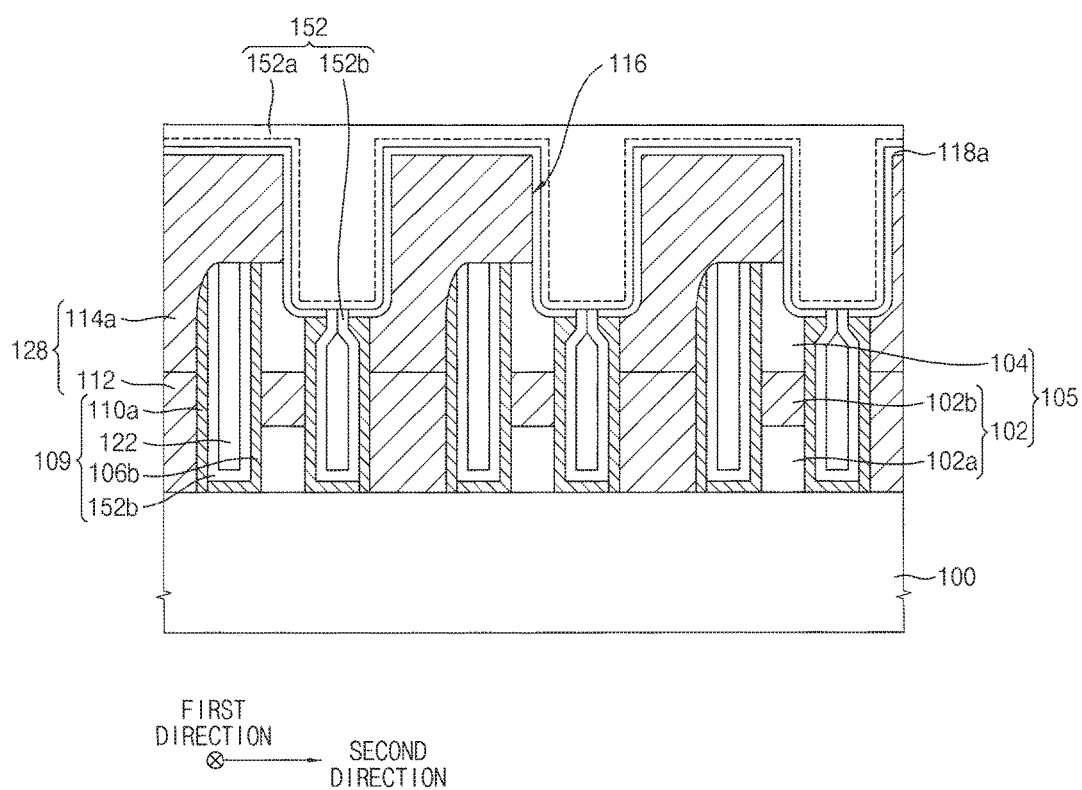

FIG. 16 is a cross-sectional view illustrating a semiconductor device in accordance with some example embodiments.

The semiconductor device may be substantially the same as a semiconductor device shown in FIGS. 1A and 1B, except for the spacer structure.

Referring to FIG. 16, the semiconductor device may include the conductive structure 105 on the substrate 100, a plurality of spacer structures 109 on the sidewall of the conductive structure 105, and the pad structure 128 between the spacer structures 109. Each of the spacer structures 109 may include a third spacer 106b, a liner layer 152b, the air spacer 122 and a fourth spacer 110a. The filling insulation layer 152a may be formed to fill the space between the pad structures 128. The spacer structure 129 may be formed on the sidewall of the conductive structure 155, and may extend in the first direction. The pad structure 128 may be formed on the substrate 100 between the spacer structures 109.

A cross-section of a portion of the spacer structure 109 on a first sidewall of the conductive structure 105 may have a shape different from that of a cross-section of a portion of the spacer structure 109 on a second sidewall opposite to the first sidewall of the conductive structure 105. That is, a space between the pad structures 128 may be defined as the second opening 116, and the spacer structure 109 may include a first portion overlapping the second opening 116 and a second portion not overlapping the second opening 116. The pad structure 128 may cover the second portion of the spacer structure 109. A height of the first portion of the spacer structure 109 may be lower than a height of the second portion of the spacer structure 109.

The third and fourth spacers 106b and 110a at the first portion of the spacer structure 109 may opposite to each other, and upper sidewalls thereof may laterally protrude toward each other. The protrusions of the third and fourth spacers 106b and 110a may be spaced apart from each other, and may not contact each other. A first distance between upper portions of the third and fourth spacers 106b and 110a, specifically, between the protrusions of the third and fourth spacers 106b and 110a may be less than a second distance between lower portions of the third and fourth spacers 106b and 110a. However, upper sidewalls of the third and fourth spacers 106b and 110a at the second portion of the spacer structure 109 may not laterally protrude toward each other.

In example embodiments, bottoms of the third and fourth spacers 106b and 110a may be connected with each other. The liner layer 152b may be conformally formed on surfaces of the third and fourth spacers 106b and 110a. The air spacer 122 may be formed at a space defined by the liner layer 152b on the surfaces of the third and fourth spacers 106b and 110a. As the liner layer 152b is formed, a width of the air spacer 122 may decrease. In example embodiments, the liner layer 152b may have a thickness substantially the same as or greater than a thickness of ½ of the first distance.

The liner layer 152b may be also formed on the capping pattern 118a. The liner layer 152b may include a material substantially the same as a material of the filling insulation layer 152a. The liner layer 152b may include, e.g., silicon nitride.

The filling insulation layer 152a may be formed on the liner layer 152b, and may fill the second opening 116. The filling insulation layer 152a may include, e.g., silicon nitride. The filling insulation layer 152a may have no void therein. The filling insulation layer 152a and the liner layer 152b form an insulating structure 152 covering the air spacer 122.

FIGS. 17 to 21 are cross-sectional views illustrating stages of a method of manufacturing a semiconductor device in accordance with some example embodiments.

First, processes illustrated with reference to FIGS. 2 to 14 may be performed to form the structure shown in FIG. 14.

Figure 17:
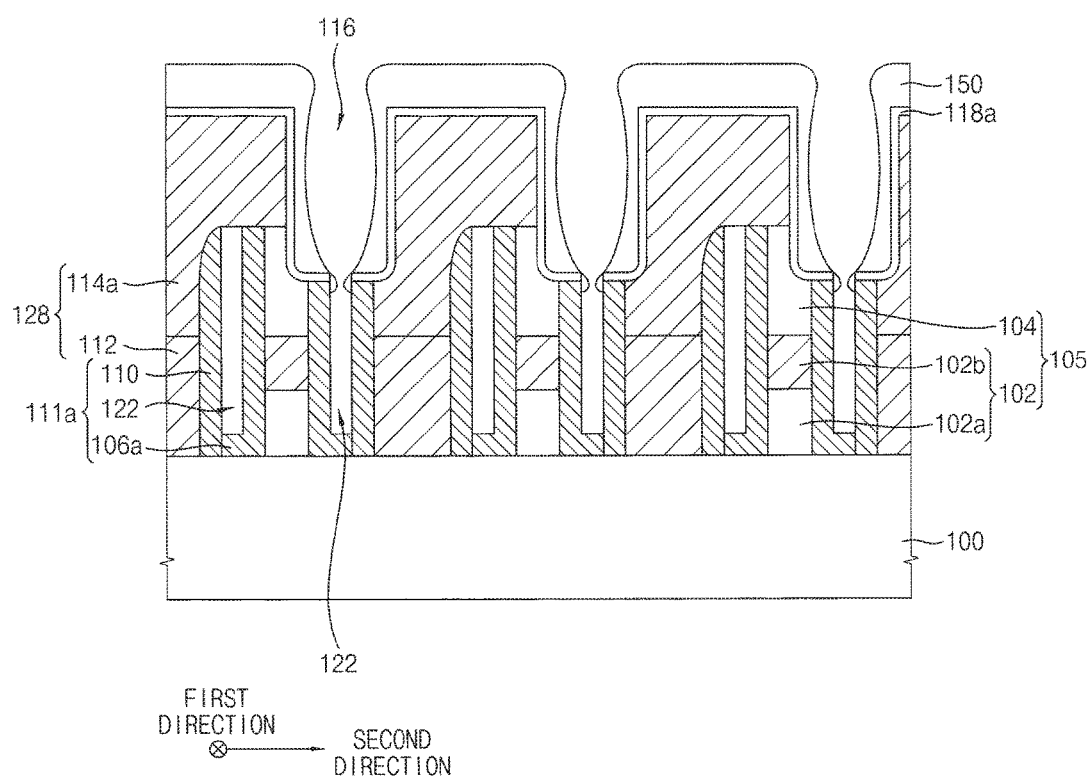

Referring to FIG. 17, a second mask layer 150 may be formed on the capping pattern 118a. The second mask layer 150 may be also formed on upper sidewalls of the first and second spacers 106a and 110. However, the second mask layer 150 may not cover a top of the air spacer 122, which may be opened.

The second mask layer 150 may serve as an etching mask in a subsequent etching process for enlarging the width of the air spacer 122. The second mask layer 150 may be formed by a deposition process having an undesirable step coverage characteristic, so that the second mask layer 150 may be deposited at selected portions. Also, the second mask layer 150 may be formed of a material that may not be etched by the subsequent etching process.

In example embodiments, the second mask layer 150 may include, e.g., carbon. For example, the second mask layer 150 may be formed of amorphous carbon layer (ACL) by an LP-CVD process.

In example embodiments, the second mask layer 150 on an upper surface of the third conductive pattern 114a may have a thickness of about 100 Å to about 1000 Å.

Figure 18:
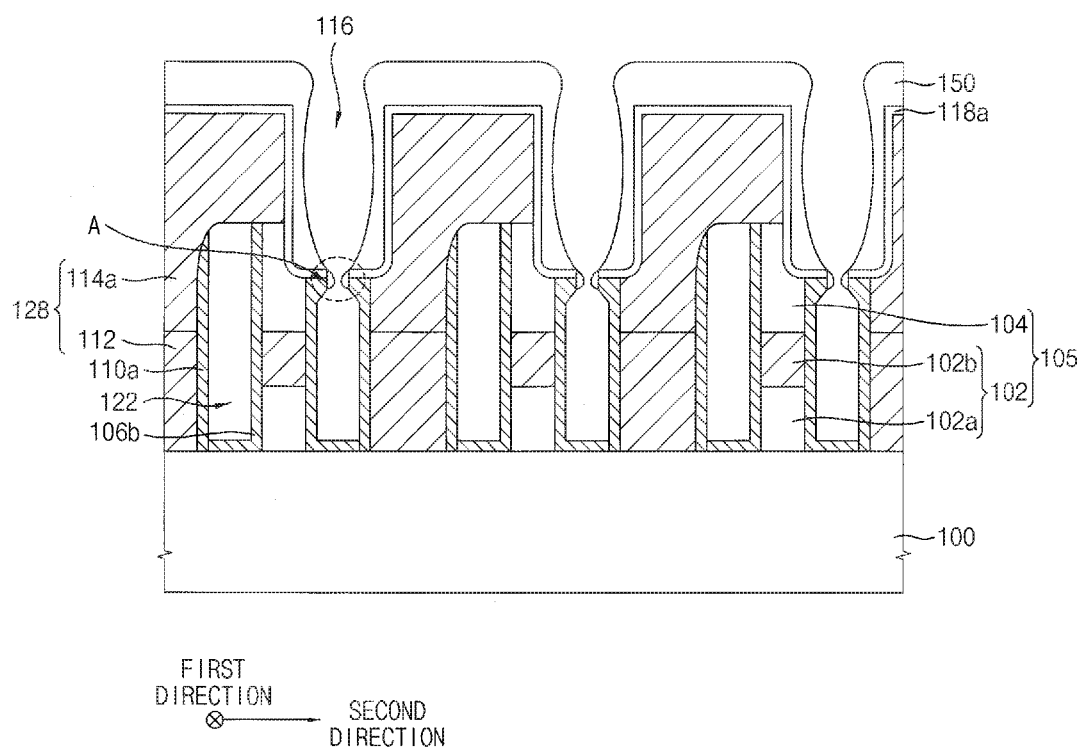

Referring to FIG. 18, the first and second spacers 106a and 110 may be partially etched using the second mask layer 150 as an etching mask to form third and fourth spacers 106b and 110a, respectively. The third and fourth spacers 106b and 110a may have thicknesses less than thicknesses of the first and second spacers 106a and 110, respectively.

Each of the first and second spacers 106a and 110 may be slightly etched, so that the first and second spacers 106a and 110 may remain after the etching process. In example embodiments, each of the first and second spacers 106a and 110 may be etched by a thickness of about 1 Å to about 3000 Å. In example embodiments, the first and second spacers 106a and 110 may be partially etched by an isotropic etching process using an etchant including hydrogen fluoride. For example, the etchant may include, e.g., LAL solution and/or buffer oxide etchant (BOE) solution, etc. When the first and second spacers 106a and 110 are etched using the LAL solution, each of the first and second spacers 106a and 110 may be etched with an etch rate of about 10 Å/minute, and thus, the first and second spacers 106a and 110 may be etched using the LAL solution to form the third and fourth spacers 106b and 110a, respectively. A width of the air spacer 122 between the third and fourth spacers 106b and 110a may be increased by the etching process.

The second mask layer 150 may cover upper sidewalls of the first and second spacers 106a and 110 under the second opening 116. Thus, the upper sidewalls of the first and second spacers 106a and 110 may not be etched, so that a width of an upper portion of each of the first and second spacers 106a and 110 may not be changed. Thus, the upper sidewalls of the third and fourth spacers 106b and 110a, which may be opposite to each other, may laterally protrude toward each other.

A first distance between the protrusions of the third and fourth spacers 106b and 110a may be less than a second distance between lower portions of the third and fourth spacers 106b and 110a.

Figure 19:
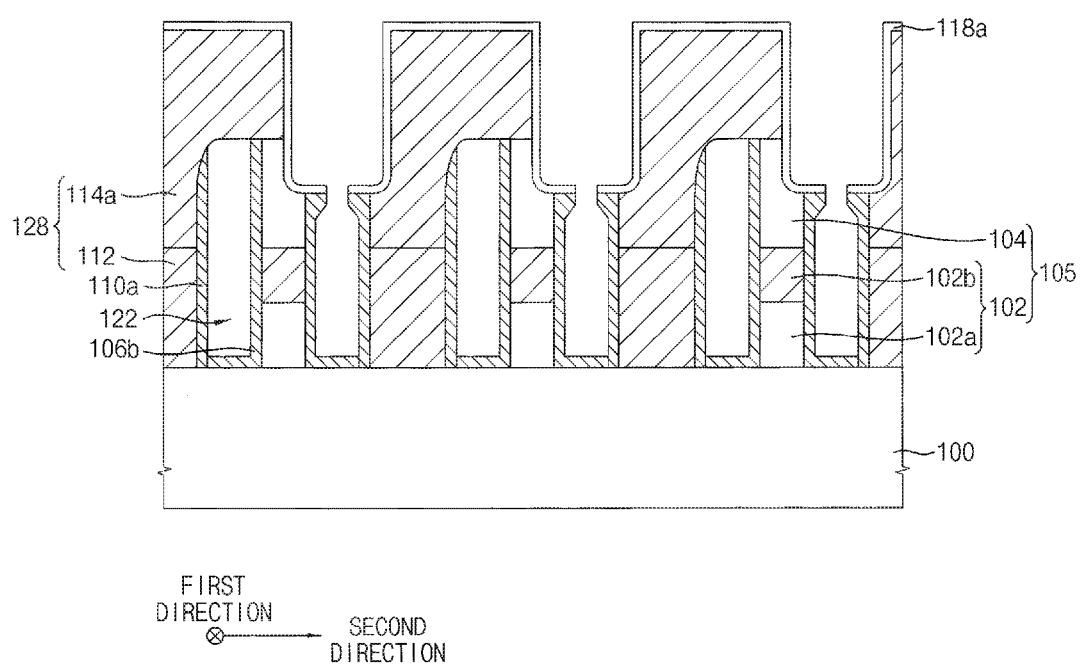

Referring to FIG. 19, the second mask layer 150 may be removed. In example embodiments, the second mask layer 150 may be completely removed by an ashing process using oxygen plasma.

Figure 20:
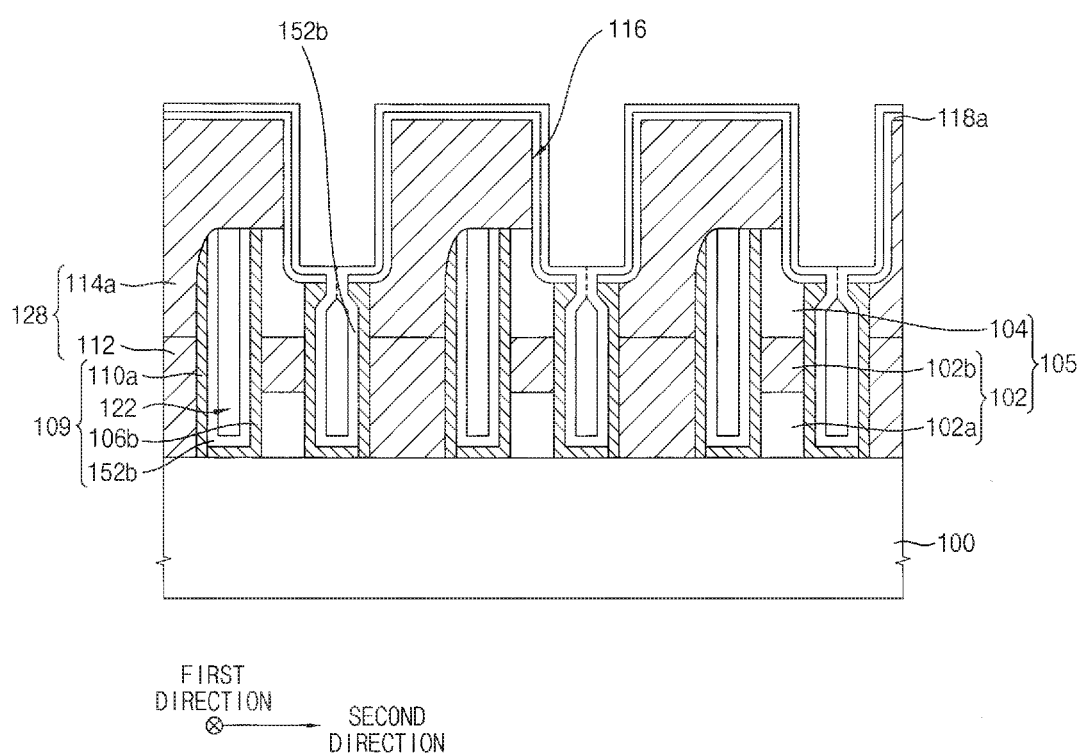

Referring to FIG. 20, a liner layer 152b may be conformally formed on surfaces of the third and fourth spacers 106b and 110a and the capping pattern 118a.

The liner layer 152b may be formed not to fill a gap between the third and the fourth spacers 106b and 110a. Thus, a space between the third and the fourth spacers may serve as the air spacer 122.

The liner layer 152b may be formed by a deposition process having an improved step coverage characteristic. In example embodiments, the liner layer 152b may be formed by an ALD process.

The liner layer 152b may be formed of, e.g., silicon nitride. When the liner layer 152b is formed to have a thickness of about ½ of the first distance, the liner layer 152b may fill the space between the protrusions of the third and fourth spacers 106b and 110a, and thus a top of the air spacer 122 may be closed. Thus, the spacer structure 109 may be formed to include the third spacer 106b, the liner layer 152b, the air spacer 122 and the fourth spacer 110a on the sidewall of the conductive structure 105.

Figure 21:
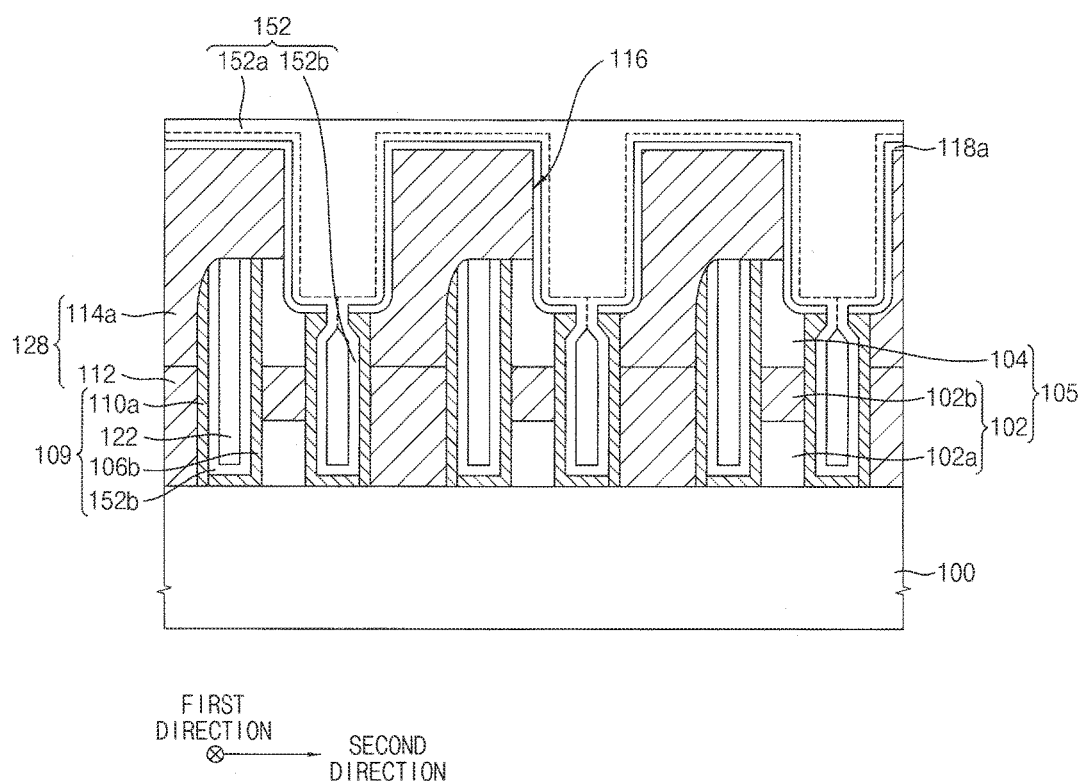

Referring to FIG. 21, the filling insulation layer 152a may be formed on the liner layer 152b to sufficiently fill the second opening 116. The filling insulation layer 152a may be formed of silicon nitride by, e.g., an ALD process.

In example embodiments, the filling insulation layer 152a and the liner layer 152b may be formed by the same deposition process, so that the filling insulation layer 152a and the liner layer 152b may form an insulating structure 152 including substantially the same material. For example, the filling insulation layer 152a and the liner layer 152b may include silicon nitride.

When the top of the air spacer 122 is closed by the liner layer 152b, the filling insulation layer 152a (e.g., a silicon nitride layer) may be formed on an inner surface of the second opening 116 and a surface of the third conductive pattern 114a, but may not be formed in the air spacer 122. As the filling insulation layer 152a is formed by the ALD process having an improved step coverage characteristic, the filling insulation layer 152a in the second opening 116 may have no void therein.

As described above, upper potions of the third and fourth spacers 106b and 110a may include the protrusions. Also, the spacer structure 109 including the air spacer 122 may be formed, and the filling insulation layer 152a having no void may be formed to fill the second opening 116.

If the filling insulation layer 152a includes a void, a size of the void may be increased by subsequent processes, and thus a portion of third conductive pattern 114a may be exposed by the void. Also, contaminated materials may be introduced into the void, and thus an operation failure and a reliability failure of the semiconductor device due to the contaminated materials may be generated.

However, in example embodiments, the filling insulation layer 152a may be formed to fill the second opening 116 by the ALD process, so that the semiconductor device may include the filling insulation layer 152a having no voids.

The conductive structure 128 may be used in wirings in various semiconductor devices. For example, the conductive structure 128 may be used in a bit line structure in a dynamic random access memory (DRAM) device.

Figure 22:
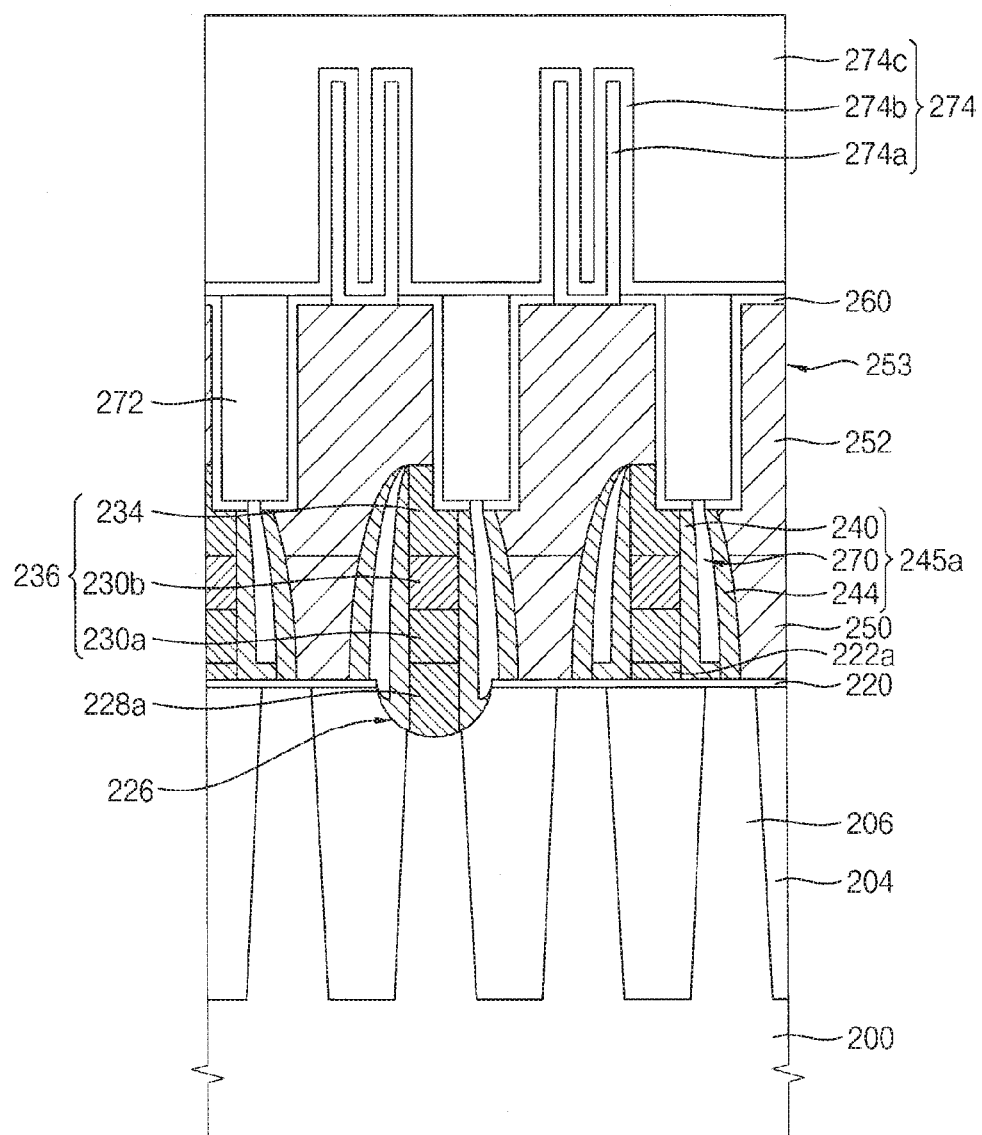

FIG. 22 is a cross-sectional view illustrating a DRAM device in accordance with some example embodiments.

Referring to FIG. 22, the DRAM device may include a substrate 200, a gate structure, bit line contacts 228a and 222a, a bit line structure 236, a spacer structure 245a, a pad structure 145a and a capacitor 274.

The substrate 200 may include an isolation pattern 204 thereon, and a portion of the substrate 200 on which the isolation pattern 204 is formed may be defined as a field region, and a portion of the substrate 200 on which no isolation pattern is formed may be defined as an active region 206. The isolation pattern 204 may include an oxide, e.g., silicon oxide.

Figure 24:
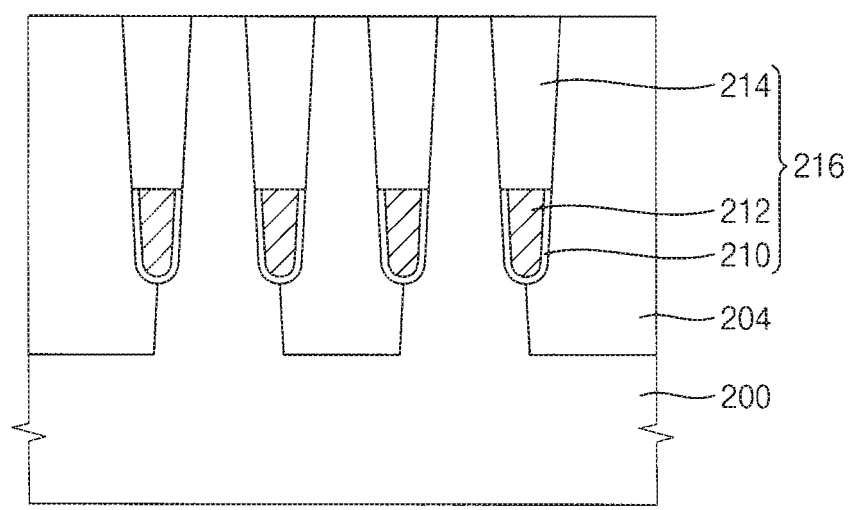

The gate structure is shown in FIG. 24.

Referring to FIG. 24, the gate structure 216 may include a gate insulation layer 210, a gate electrode 212 and a first capping pattern 214 sequentially stacked, and may be buried at an upper portion of the substrate 200. The gate insulation layer 210 may surround a sidewall and a bottom surface of the gate electrode 212. In example embodiments, the gate structure 216 may extend in the second direction, and a plurality of gate structures 216 may be formed in the first direction. Impurity regions (not shown) may be formed at an upper portion of the active region 206 adjacent to the gate structure 216. The gate structure 216 and the impurity regions may form a transistor.

Referring to FIG. 22 again, the bit line contacts 228a and 222a may be disposed on a pad insulation pattern 220 and a bottom of a recess 226. The bit line contacts 228a and 222a may include, e.g., doped polysilicon.

The bit line structure 236 may be formed on each of the bit line contacts 228a and 222a. The bit line structure 236 may be substantially the same as or similar to the conductive structure 105 illustrated with reference to FIG. 1.

That is, the bit line structure 236 may include a first conductive pattern and a hard mask 234 sequentially stacked. In example embodiments, the first conductive pattern may include a polysilicon pattern 230a and a metal pattern 230b sequentially stacked. The bit line structure 236 may extend in the first direction.

The spacer structure 245a may be substantially the same as or similar to the spacer structure 111a illustrated with reference to FIG. 1.

That is, the spacer structure 245a may include a first spacer 240, an air spacer 270 and a second spacer 244 sequentially stacked on sidewalls of the bit line structure 236 and each of the bit line contacts 228a and 222a.

An insulation layer (not shown) may fill a gap between a plurality of spacer structures 245a. The insulation layer may include silicon nitride.

The pad structure 253 may extend through the insulation layer between the spacer structures 245a, and may contact the substrate 200. The pad structure 253 may be substantially the same as or similar to the pad structure 128 illustrated with reference to FIG. 1.

In example embodiments, the pad structure 253 may include a second conductive pattern 250 and a third conductive pattern 252 sequentially stacked. The second conductive pattern 250 may fill a lower portion of a gap between the spacer structures 245a. The third conductive pattern 252 may be arranged in a honeycomb shape.

A second capping pattern 260 may cover surfaces of the pad structure 253, the bit line structure 236, the spacer structure 245a and the insulation layer. The second capping pattern 260 may serve as a protection layer of the third conductive pattern 252. A filling insulation layer 272 may be formed on the second capping pattern 260 and the air spacer 270, and may fill a second opening between the pad structures 253.

The capacitor 274 may be formed on the pad structure 253. Thus, the capacitor 274 may be arranged in a honeycomb shape.

FIGS. 23 to 30 are cross-sectional views and plan views illustrating stages of a method of manufacturing a DRAM device.

Figure 23:
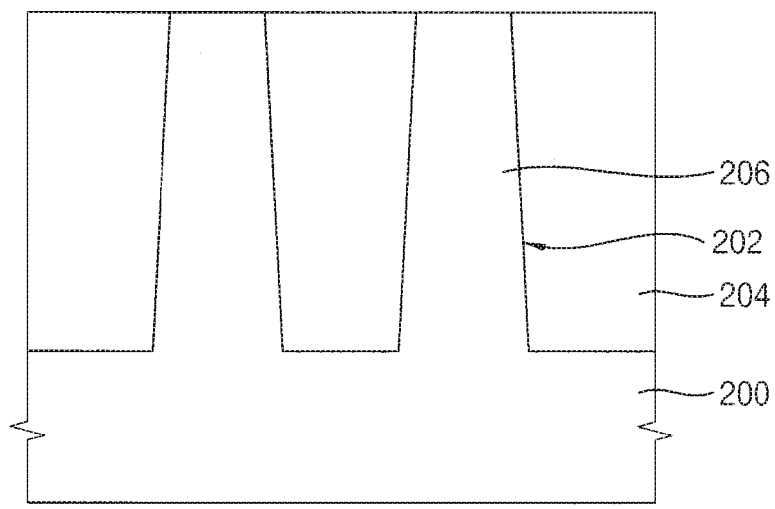
Figure 25:
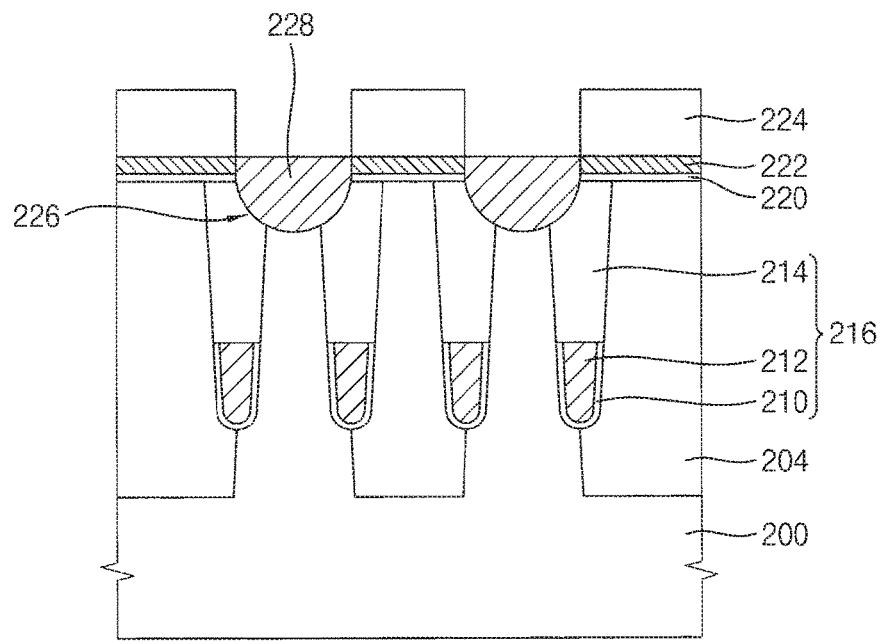

Particularly, FIGS. 23 to 25 are cross-sectional views taken along the first direction, and FIGS. 26 to 30 are cross-sectional views taken along the second direction.

Referring to FIG. 23, a first etching mask (not shown) may be formed on a substrate 200. The substrate 200 may be etched using the first etching mask to form a first trench 202. The first etching mask may be formed of a nitride, e.g., silicon nitride.

An isolation pattern 204 may be formed in the first trench 202. The isolation pattern 204 may be formed by forming an isolation layer on the substrate 200 to sufficiently fill the first trench 202, and planarizing an upper portion of the isolation layer until a top surface of the substrate 200 may be exposed. The isolation layer may be formed to include an oxide, e.g., silicon oxide, etc.

Thus, a portion of the substrate 200 on which the isolation pattern 204 is formed may be defined as a field region, and a portion of the substrate 200 on which no isolation layer pattern is formed may be defined as an active region 206. In example embodiments, the first etching mask may be removed by an isotropic etching process, after forming the isolation pattern 204.

Referring to FIG. 24, impurities may be doped into an upper portion of the substrate 200 to form an impurity region (not shown). The substrate 200 and the isolation pattern 204 may be partially etched to form a second trench (not shown), and a gate structure 216 may be formed in the second trench. In example embodiments, the second trench may extend in the second direction, and a plurality of second trenches may be formed in the first direction.

The gate structure 216 may be formed to include a gate insulation layer 210, a gate electrode 212 and a first capping pattern 214. The gate insulation layer 210 may be formed on a lower inner surface of the second trench, the gate electrode 212 may be formed on the gate insulation layer 210 to fill a lower portion of the second trench, and the first capping pattern 214 may be formed on the gate insulation layer 210 and the gate electrode 212 to fill an upper portion of the second trench.

Referring to FIG. 25, a pad layer, a first polysilicon layer and a second etching mask 224 may be sequentially formed on the substrate 200, the isolation pattern 204 and the first capping pattern 214. The pad layer may be formed to include an oxide, e.g., silicon oxide.

The first polysilicon layer, the pad layer and an upper portion of the substrate 200 may be etched using the second etching mask 224 to form a recess 226, and a second polysilicon pattern 228 may be formed on the substrate 200 to fill the recess 226. When the recess is formed, the first polysilicon layer and the pad layer may be partially etched to form a first polysilicon pattern 222 and the pad insulation pattern 220, respectively.

Then, the second etching mask 224 may be removed by an isotropic etching process.

FIGS. 26 to 30 are cross-sectional views of a portion of the DRAM device between the gate structures 216, and thus the gate structure 216 is not shown therein.

Figure 26:
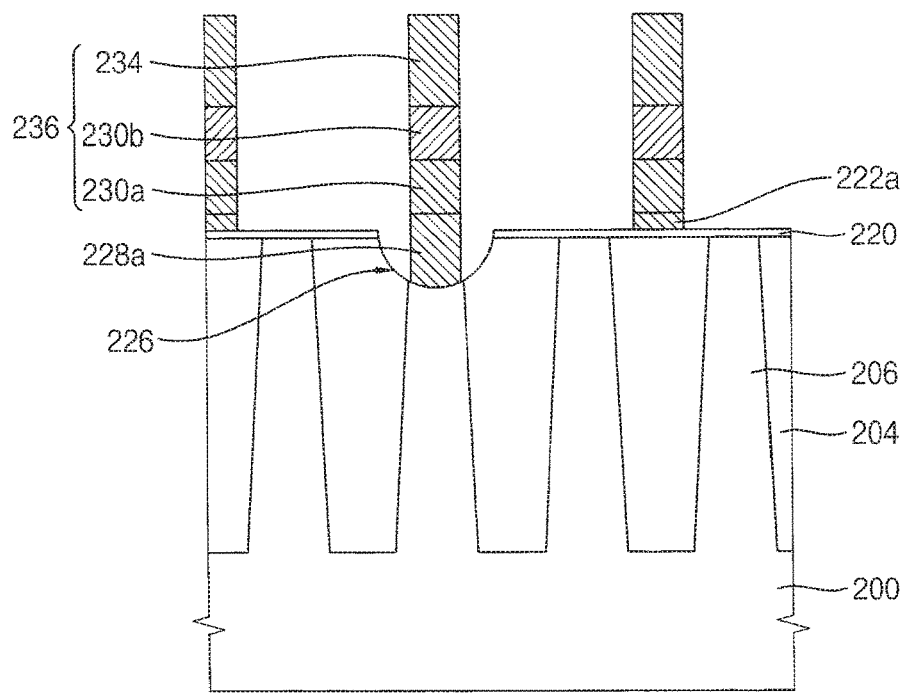

Referring to FIG. 26, a first conductive layer and a hard mask layer may be sequentially formed on the first and second polysilicon patterns 222 and 228.

In example embodiments, the first conductive layer may be formed to include a polysilicon layer and a metal layer sequentially stacked. The hard mask layer may be formed of a nitride, e.g., silicon nitride.

The hard mask layer may be patterned by a photolithograph process, so that a hard mask 234 may be formed on the first conductive layer. The first conductive layer and the first and second polysilicon patterns 222 and 228 may be sequentially etched using the hard mask as an etching mask to form bit line contacts 222a and 228a. The bit line contact 222a on the pad insulation pattern 220 may not be electrically connected to the substrate 200. The bit line contact 228a in the recess 226 may contact the substrate 200. Thus, the bit line contact 228a in the recess 226 may serve as an actual contact plug.

A bit line structure 236 may be formed on each of the bit line contacts 222a and 228a. The bit line structure 236 may include a first conductive pattern and a hard mask 234 sequentially stacked. The first conductive pattern may include a polysilicon pattern 230a and a metal pattern 230b sequentially stacked. The bit line structure 236 may extend in the first direction, and a plurality of bit line structures 236 may be formed in the second direction.

Figure 27:
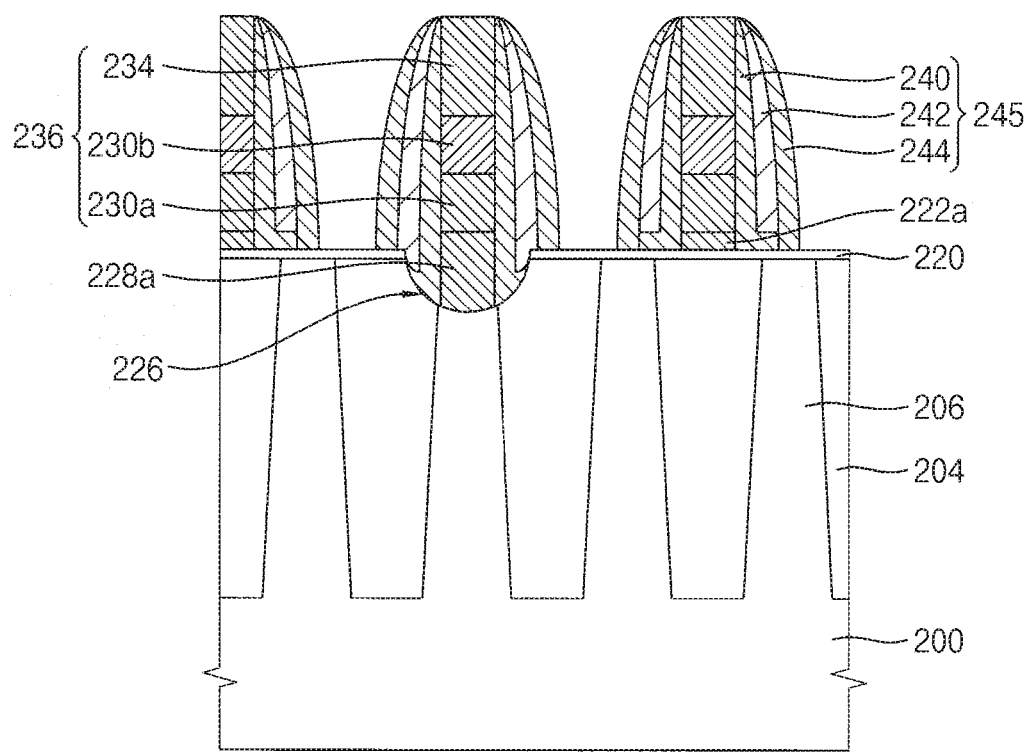

Referring to FIG. 27, a first spacer layer and a first sacrificial layer may be sequentially formed on the substrate 200, the bit line contacts 228a and 222a and the bit line structure 236. The first spacer layer and the first sacrificial layer may be anisotropically etched to form a first spacer 240 and a sacrificial spacer 242, respectively, on sidewalls of the bit line contacts 228a and 222a and the bit line structure 236. A second spacer 244 may be formed on the sacrificial spacer 242.

Thus, a preliminary spacer structure 245 including the first spacer 240, the sacrificial spacer 242 and the second spacer 244 sequentially stacked may be formed on the sidewalls of the bit line contacts 228a and 222a and the bit line structure 236.

The preliminary spacer structure 245 may be formed by performing processes substantially the same as or similar to processes illustrated with reference to FIGS. 3 to 5.

Figure 28:
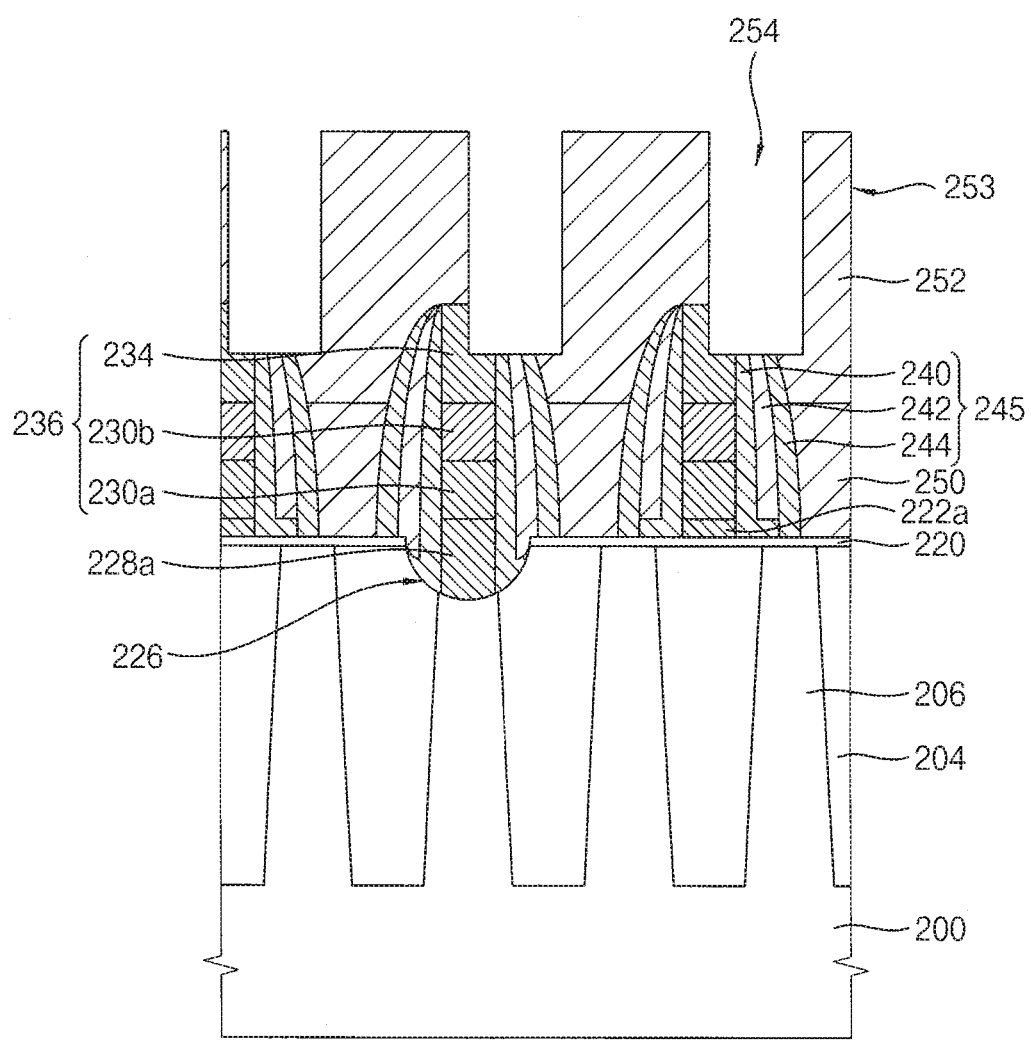

Referring to FIG. 28, an insulation layer (not shown) may be formed to fill a gap between a plurality of preliminary spacer structures 245. The insulation layer may be partially etched to form a first opening. A second conductive pattern 250 may be formed to fill a lower portion of the first opening.

A third conductive layer may be formed on the second conductive pattern 250, the insulation layer and the bit line structure 236 to sufficiently fill the gap between the preliminary spacer structures 245. The third conductive layer may be patterned to form a third conductive pattern 252 on the second conductive pattern 250. A space between the third conductive patterns 252 may be defined as a second opening 254.

The processes may be substantially the same as or similar to processes illustrated with reference to FIGS. 6 to 10.

Figure 29:
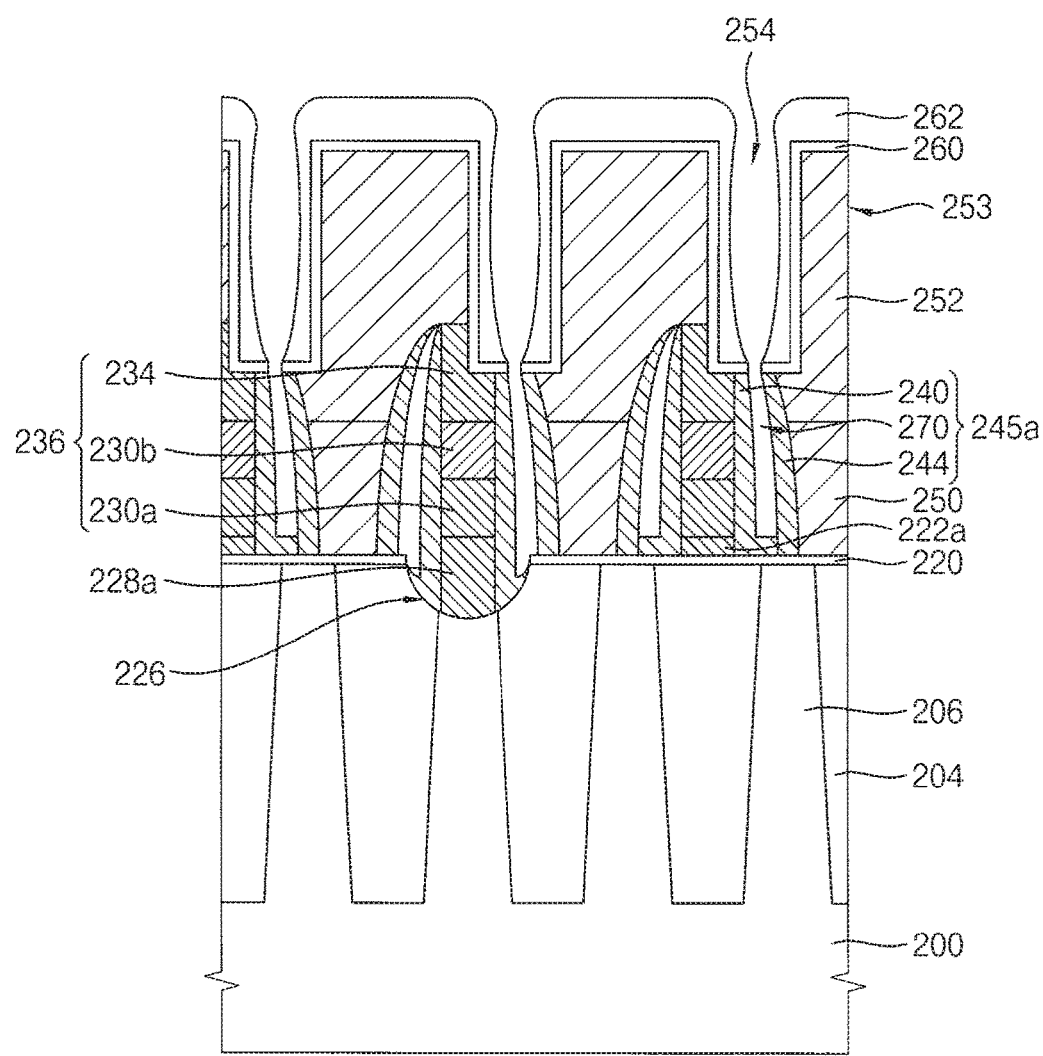

Referring to FIG. 29, a capping layer may be conformally formed on the third conductive pattern 252, the preliminary spacer structure 245 exposed by the second opening 254, and the bit line structure 236. A first mask layer may be formed on the capping layer. The first mask layer and the capping layer may be anisotropically etched to form a first mask 262 and a second capping pattern 260, respectively. An upper surface of the sacrificial spacer 242 may be exposed by the second opening 254.

The processes may be substantially the same as or similar to processes illustrated with reference to FIGS. 11 to 12.

The sacrificial spacer 242 may be isotropically etched to form an air spacer 270. The isotropic etching process may include a wet etching process. Thus, the first spacer 240, the air spacer 270 and the second spacer 244 may form a spacer structure 245a.

Figure 30:
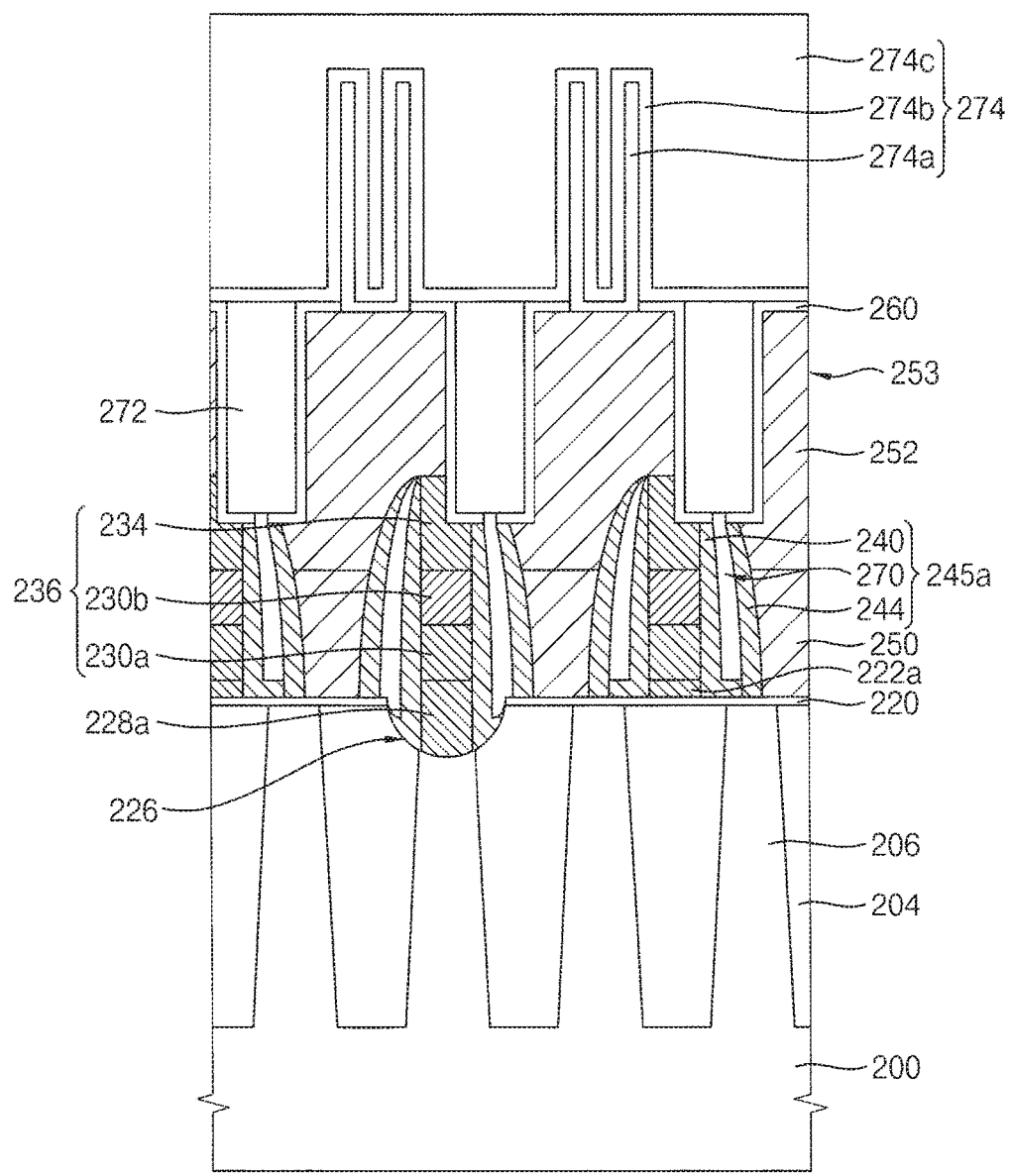

Referring to FIG. 30, the first mask 262 may be removed. A filling insulation layer 272 may be formed on the second capping pattern 260. The filling insulation layer 272 may fill the second opening 254, but may not fill the air spacer 270.

Then, a capacitor 274 may be formed on the third conductive pattern 252. The capacitor 274 may include a lower electrode 274a, a dielectric layer 274b and an upper electrode 274c sequentially stacked.

As described above, the DRAM device including the air spacer 270 on the sidewall of the bit line structure 236 may be manufactured.

Figure 31:
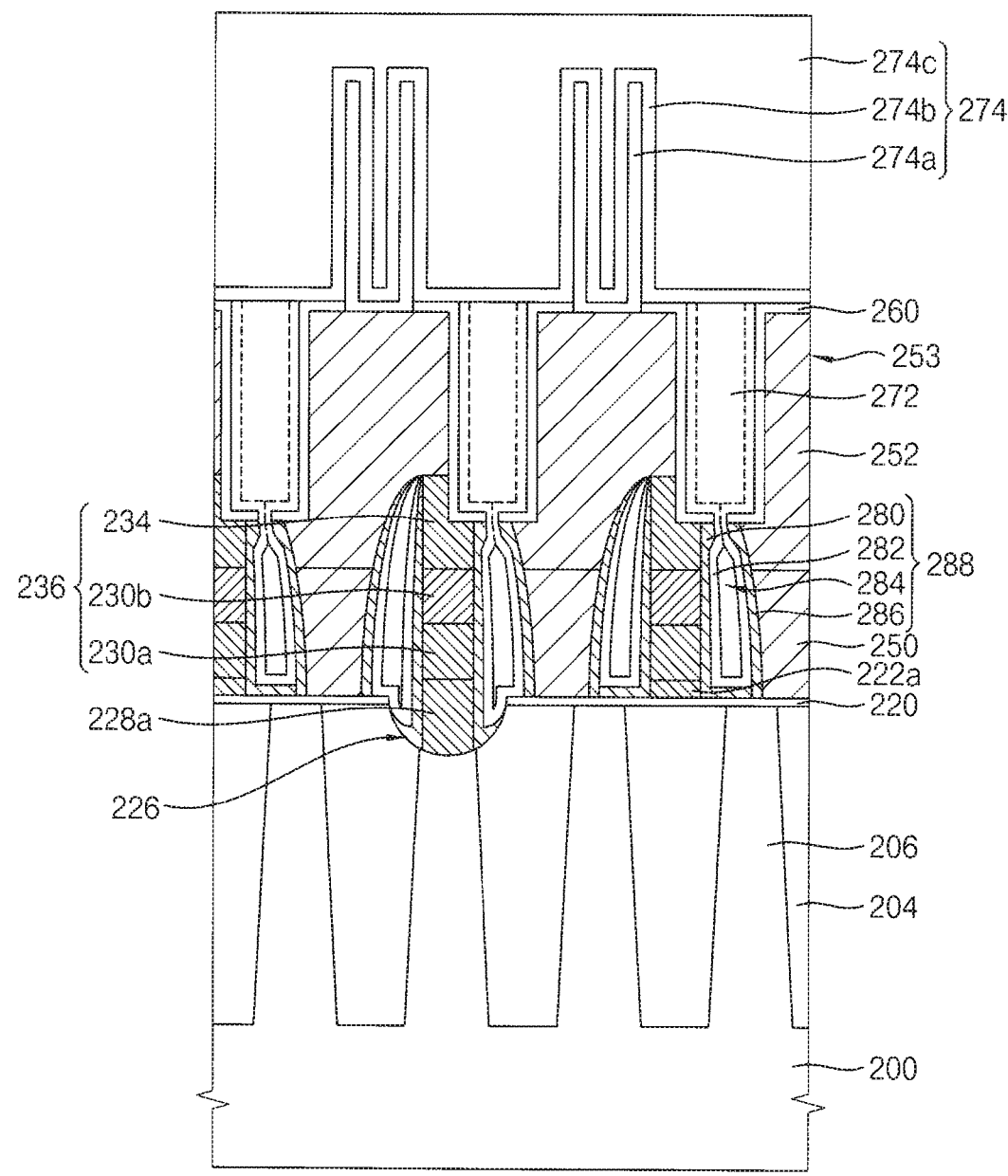

FIG. 31 is a cross-sectional view illustrating a DRAM device in accordance with some example embodiments.

The DRAM device may be substantially the same as a DRAM device shown in FIG. 22, except for the spacer structure. The spacer structure in the DRAM device may be substantially the same as the spacer structure shown in FIG. 16.

Referring to FIG. 31, a spacer structure 288 may include a third spacer 280, a liner layer 282, an air spacer 284 and a fourth spacer 286.

First, processes illustrated with reference to FIGS. 23 to 29 may be performed to form the structure shown in FIG. 29.

Then, a second mask layer may be formed on a surface of the second capping pattern 260. The first and second spacers 240 and 244 may be partially etched using the second mask layer as an etching mask to form third and fourth spacers 280 and 286, respectively. The third and fourth spacers 280 and 286 may have thicknesses less than thicknesses of the first and second spacers, respectively. The second mask 244 may be removed. A filling insulation layer 272 may be formed to sufficiently fill the second opening, and a liner layer 282 may be formed on the third and fourth spacers 280 and 286. Thus, a gap between the liner layers 282 may serve as an air spacer 284. The processes may be substantially the same as or similar to processes illustrated with reference to FIGS. 17 to 21.

Then, a capacitor 274 may be formed on the third conductive pattern 252. Thus, the DRAM device may be manufactured.

As described above, in example embodiments, the semiconductor device may include the air spacer 284, so that a parasitic capacitance between conductive structures may decrease. Also, when the air spacer 284 is formed, corrosions of the conductive structures may decrease.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the example embodiments. Accordingly, all such modifications are intended to be included within the scope of the example embodiments as defined in the claims. In the claims, means-plus-function clauses are intended to cover the structures described herein as performing the recited function and not only structural equivalents but also equivalent structures.

Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A method of manufacturing a semiconductor device, the method comprising:
   forming a plurality of conductive structures on a substrate, each of the conductive structures including a first conductive pattern and a hard mask sequentially stacked;
   forming a plurality of preliminary spacer structures on sidewalls of the conductive structures, respectively, the preliminary spacer structures including first spacers, sacrificial spacers and second spacers sequentially stacked;
   forming a plurality of pad structures on the substrate between the preliminary spacer structures, respectively, the plurality of pad structures defining openings exposing upper portions of the sacrificial spacers;
   forming a capping layer on surfaces of the pad structures;
   forming a first mask pattern on the pad structures, the first mask pattern covering the surfaces of the pad structures and exposing the upper portions of the sacrificial spacers; and
   removing the sacrificial spacers to form first spacer structures having respective air spacers, the first spacer structures including the first spacers, the air spacers and the second spacers sequentially stacked on the sidewalls of the conductive structures.

2. The method as claimed in claim 1, wherein the forming a first mask pattern includes:
   forming a mask layer on an inner surface of the openings and upper surfaces of the pad structures, wherein a portion of the mask layer on the upper surfaces of the pad structures has a first thickness and a portion of the mask layer on a bottom surface of the opening has a second thickness less than the first thickness; and
   etching the mask layer anisotropically to expose an upper surface of the sacrificial spacers.

3. The method as claimed in claim 2, wherein the forming a mask layer includes a low pressure-chemical vapor deposition (LP-CVD) process.

4. The method as claimed in claim 1, wherein the first mask pattern includes amorphous carbon.

5. The method as claimed in claim 1, wherein the capping layer includes silicon nitride.

6. The method as claimed in claim 1, further comprising:
   forming a filling insulation layer on the air spacers to fill the openings after the forming first spacer structures.

7. The method as claimed in claim 1, wherein the forming first spacer structures removes the sacrificial spacers by a wet etching process.

8. The method as claimed in claim 1, wherein a bottom surface of the openings is lower than a top surface of each of the conductive structures.

9. The method as claimed in claim 1, wherein the forming a plurality of pad structures includes:
   forming first conductive patterns on the substrate between the preliminary spacer structures, wherein an upper surface of each of the first conductive patterns is lower than an upper surface of each of the conductive structures;
   forming a second conductive layer on the first conductive patterns to cover each of the conductive structures; and
   patterning the second conductive layer to form second conductive patterns covering upper portions of the conductive structures.

10. The method as claimed in claim 9, wherein the second conductive layer includes a metal.

11. The method as claimed in claim 1, after the forming first spacer structures, further comprising:
   forming a second mask pattern on upper sidewalls of the first and second spacers, an inner surface of the openings and the pad structures, wherein the air spacers are not covered by the second mask pattern;
   etching sidewalls of the first and second spacers using the second mask pattern to form third and fourth spacers, respectively;
   forming second spacer structures by forming liner layers on surfaces of the third and fourth spacers and the openings, the second spacer structures including the third spacers, the fourth spacers, the liner layers and the air spacers; and
   forming a filling insulation layer on the liner layers to fill the openings by an atomic layer deposition (ALD) process.

12. A method of manufacturing a semiconductor device, the method comprising:
   forming a plurality of conductive structures on a substrate, each of the conductive structures including a first conductive pattern and a hard mask sequentially stacked;
   forming a plurality of first preliminary spacer structures on sidewalls of the conductive structures, the first preliminary spacer structures including first spacers, sacrificial spacers and second spacers sequentially stacked;
   forming a plurality of pad structures on the substrate between the first preliminary spacer structures, the plurality of pad structures defining openings exposing an upper portion of the sacrificial spacers;
   forming a plurality of second preliminary spacer structures by removing the sacrificial spacers to form air spacers, the second preliminary spacer structures including the first spacers, the air spacers and the second spacers sequentially stacked on the sidewalls of the conductive structures;
   forming a mask pattern on upper sidewalls of the first and second spacers, an inner surface of the openings and the pad structures, wherein the air spacers are not covered by the mask pattern;
   etching sidewalls of the first and second spacers using the mask pattern to form third and fourth spacers, respectively;
   forming spacer structures by forming a liner layer on surfaces of the third and fourth spacers and the openings, the spacer structures including the third spacers, the fourth spacers, the liner layers and the air spacers; and
   forming a filling insulation layer on the liner layers to fill the openings.

13. The method as claimed in claim 12, wherein each of the liner layers and the filling insulation layer include silicon nitride.

14. The method as claimed in claim 12, wherein each of the liner layers and the filling insulation layer is formed by an atomic layer deposition (ALD) process.

15. A method comprising:
   forming a first conductive pattern on a substrate;

forming first spacer structures on sidewalls of the first conductive pattern, respectively, each of the first spacer structures including a sacrificial spacer between respective first and second spacers;

forming a second conductive pattern on the substrate between the first spacer structures;

forming a third conductive pattern on the second conductive pattern, the third conductive pattern defining openings exposing the respective sacrificial spacers; and forming second spacer structures by removing the sacrificial spacers to form air spacers between the respective first and second spacers, the second spacer structures including the first spacers, the air spacers and the second spacers sequentially stacked on the sidewalls of the first conductive pattern.

16. The method as claimed in claim 15, further comprising:

forming a filling insulation layer on a top portion of the air spacers to fill the openings after the forming second spacer structures.

17. The method as claimed in claim 15, wherein the forming second spacer structures removes the sacrificial spacers by a wet etching process.

18. The method as claimed in claim 15, wherein a bottom surface of the openings is lower than a top surface of the first conductive pattern.

19. The method as claimed in claim 15, further comprising:

forming a mask layer on an inner surface of the openings and an upper surface of the third conductive pattern by a low pressure-chemical vapor deposition (LP-CVD) process; and etching the mask layer anisotropically to form a mask pattern exposing the sacrificial spacers, the mask pattern including amorphous carbon.

20. The method of claim 1, wherein the forming the first conductive pattern includes forming a metal pattern, the metal pattern being a single phase material layer; and the forming the plurality of conductive structures includes forming a hardmask directly on the metal pattern and the metal pattern directly on a polysilicon pattern.

* * * * *